US012610546B2

(12) United States Patent
Hopkins et al.

(10) Patent No.: US 12,610,546 B2
(45) Date of Patent: Apr. 21, 2026

(54) ELECTRONIC DEVICES INCLUDING AN IMPLANT STRUCTURE, FOR PROTECTION AGAINST CORROSION, AND RELATED SYSTEMS AND METHODS

(71) Applicant: Micron Technology, Inc., Boise, ID (US)

(72) Inventors: John D. Hopkins, Meridian, ID (US); Jordan D. Greenlee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 605 days.

(21) Appl. No.: 17/813,847

(22) Filed: Jul. 20, 2022

(65) Prior Publication Data

US 2024/0032295 A1 Jan. 25, 2024

(51) Int. Cl.
| | |
|---|---|
| *H10B 43/27* | (2023.01) |
| *H10B 41/48* | (2023.01) |
| *H10D 64/01* | (2025.01) |

(52) U.S. Cl.
CPC ............ *H10B 43/27* (2023.02); *H10B 41/48* (2023.02); *H10D 64/037* (2025.01)

(58) Field of Classification Search
CPC ........ H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | | | |
|---|---|---|---|---|---|
| 9,741,737 | B1 * | 8/2017 | Huang | .................. | H10B 43/35 |
| 11,737,273 | B2 * | 8/2023 | Nam | ...................... | H10B 41/40 |
| 11,839,074 | B2 * | 12/2023 | Heo | ........................ | H10B 41/27 |
| 2005/0082601 | A1 | 4/2005 | Chu et al. | | |
| 2017/0162594 | A1 * | 6/2017 | Ahn | ........................ | H10B 41/27 |
| 2017/0256551 | A1 * | 9/2017 | Lee | ........................ | H10B 41/40 |

(Continued)

OTHER PUBLICATIONS

Hopkins et al., Integrated Assemblies, and Methods of Forming Integrated Assemblies, filed Dec. 18, 2020, U.S. Appl. No. 17/126,777, 66 pages.

(Continued)

*Primary Examiner* — William B Partridge
*Assistant Examiner* — Gustavo G Ramallo
(74) *Attorney, Agent, or Firm* — Traskbritt

(57) ABSTRACT

Electronic devices comprising a source stack comprising one or more conductive materials, a source contact adjacent to the source stack, tiers of alternating conductive materials and insulative materials adjacent to the source contact, pillars extending through the tiers and the source contact and into the source stack, a slit structure extending through the tiers and the source contact, and an implant structure extending within the slit structure and into the source stack. Related methods and systems are also disclosed.

24 Claims, 18 Drawing Sheets

(56) References Cited

U.S. PATENT DOCUMENTS

| | | | | |
|---|---|---|---|---|
| 2017/0338241 | A1* | 11/2017 | Lee | H10B 43/35 |
| 2018/0122906 | A1 | 5/2018 | Yu et al. | |
| 2018/0261671 | A1* | 9/2018 | Matsumoto | H10B 41/41 |
| 2019/0244970 | A1* | 8/2019 | Jung | H10B 43/10 |
| 2019/0273088 | A1* | 9/2019 | Cui | H10B 41/27 |
| 2019/0333931 | A1 | 10/2019 | Jung et al. | |
| 2020/0388634 | A1 | 12/2020 | Jung et al. | |
| 2021/0036001 | A1 | 2/2021 | Kim et al. | |
| 2021/0143167 | A1 | 5/2021 | Howder et al. | |
| 2021/0257387 | A1 | 8/2021 | Huang et al. | |
| 2021/0358929 | A1 | 11/2021 | Hopkins et al. | |
| 2021/0358938 | A1 | 11/2021 | Hopkins | |
| 2021/0358939 | A1 | 11/2021 | Hopkins et al. | |
| 2021/0375903 | A1 | 12/2021 | Hopkins | |
| 2021/0376083 | A1 | 12/2021 | Greenlee et al. | |
| 2021/0384208 | A1 | 12/2021 | Hopkins et al. | |
| 2021/0384216 | A1 | 12/2021 | Greenlee et al. | |
| 2022/0068965 | A1 | 3/2022 | Chandolu et al. | |
| 2022/0149067 | A1 | 5/2022 | Hopkins et al. | |

OTHER PUBLICATIONS

Hopkins et al., Methods of Forming Microelectronic Devices, and Related Microelectronic Devices, and Electronic Systems, filed Sep. 4, 2020, U.S. Appl. No. 17/012,741, 56 pages.

Hopkins et al., Microelectronic Devices Including Cap Structures, and Related Electronic Systems and Methods, filed Dec. 27, 2021, U.S. Appl. No. 63/266,027, 71 pages.

Howder et al., Microelectronic Devices Including Filled Slits and Memory Cell Pillars, and Related Memory Devices, Electronic Systems, and Methods, filed Apr. 16, 2021, U.S. Appl. No. 17/233,158, 46 pages.

Lindemann et al., Electronic Devices Comprising a Dielectric Material, and Related Systems and Methods, filed Jan. 26, 2021, U.S. Appl. No. 17/158,918, 55 pages.

Liu et al., Microelectronic Devices With Vertically Recessed Channel Structures and Discrete, Spaced Inter-Slit Structures, and Related Methods and Systems, filed Jan. 26, 2021, U.S. Appl. No. 17/158,888, 92 pages.

\* cited by examiner

ELECTRONIC DEVICES INCLUDING AN IMPLANT STRUCTURE, FOR PROTECTION AGAINST CORROSION, AND RELATED SYSTEMS AND METHODS

The subject matter of this application is related to the subject matter of U.S. patent application Ser. No. 17/813,795, titled "ELECTRONIC DEVICES COMPRISING A SOURCE IMPLANT REGION, AND RELATED ELECTRONIC SYSTEMS AND METHODS," and U.S. patent application Ser. No. 17/813,818, titled "ELECTRONIC DEVICES COMPRISING AN OXIDE FILL REGION, AND RELATED ELECTRONIC SYSTEMS AND METHODS," each of which was filed on Jul. 20, 2022, the same date as this application.

TECHNICAL FIELD

Embodiments of the disclosure relate to the field of electronic device design and fabrication. More particularly, the disclosure relates to electronic devices including an implant structure within an upper portion of a source stack and laterally adjacent to a source contact, and related systems and methods for forming the electronic devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a three-dimensional (3D) NAND memory device, not only are the memory cells arranged in rows and columns in a horizontal array, but tiers of the horizontal arrays are stacked over one another (e.g., as vertical strings of memory cells) to provide a 3D array of the memory cells. The stack of tiers vertically alternate conductive materials with insulative materials, with the conductive materials functioning as access lines (e.g., word lines) and gate structures (e.g., control gates) for the memory cells. Pillars comprising channels and tunneling structures extend along and form portions of the memory cells of individual vertical strings of memory cells. A drain end of a string is adjacent one of the top or bottom of the pillar, while a source end of the string is adjacent the other of the top or bottom of the pillar. The drain end is operably connected to the bit line, and the source end is operably connected to a source line of a source stack. A 3D NAND memory device also includes electrical connections between, e.g., the access lines (e.g., word lines) and other conductive structures of the device so that the memory cells of the vertical strings can be selected for writing, reading, and erasing operations.

In conventional 3D NAND memory devices, the pillars including the channels are formed through multiple polysilicon materials, and contact between the channels and other electrically conductive components of the memory devices is achieved by a laterally-oriented contact, which may be doped polysilicon material. However, etching the multiple polysilicon materials may cause processing challenges, such as over-etching, since multiple polysilicon materials are present.

DETAILED DESCRIPTION

Figure 1A:
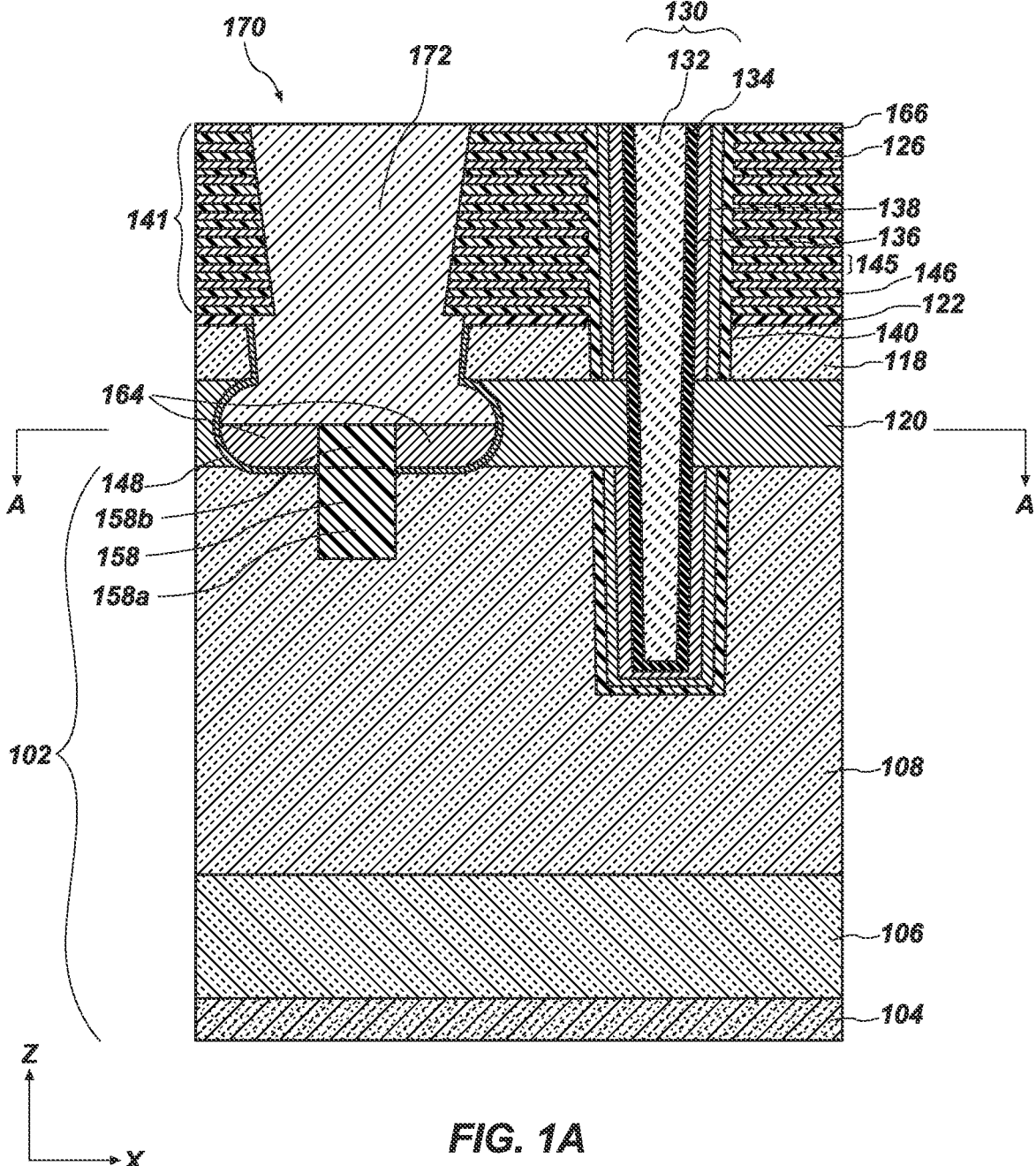
FIG. 1A is a simplified partial cross-sectional view of an electronic device in accordance with embodiments of the disclosure.

Electronic devices (e.g., apparatus, microelectronic devices) and systems (e.g., electronic systems) according to embodiments of the disclosure include a source stack comprising one or more conductive materials and a source contact (e.g., a lateral contact region) adjacent to the source stack. Tiers of alternating conductive materials and insulative materials are adjacent to the source contact. Pillars (e.g., memory pillars) extend through the tiers and the source contact and into the source stack, and a slit structure (e.g., a slot structure, a replacement gate slot structure) extends through the tiers and the source contact. An implant structure (e.g., a source implant region) extends within the slit structure and into the source stack. The source contact is located laterally adjacent to (e.g., at an elevational level of) an upper portion of the implant structure, and the source contact comprises a conductive material extending laterally adjacent to a channel of the pillars. In some embodiments, a conductive material (e.g., a source level conductive material) is present within the slit structure and laterally interposed between the implant structure and the source contact. In other embodiments, the implant structure separates opposing portions of a dielectric material of the slit structure.

Fabrication of the electronic device includes forming a source stack comprising a doped semiconductive material and forming a source contact sacrificial structure adjacent to the doped semiconductive material. Tiers of alternating insulative materials and additional insulative materials are formed adjacent to the source contact sacrificial structure, and pillars including a channel are formed through the tiers and into the source stack. A slit may be formed through the tiers to expose the source contact sacrificial structure. The source contact sacrificial structure may be removed to form a source contact opening, and a conductive material may be formed in the source contact opening to form a source contact extending laterally and substantially surrounding the channel of the pillars. A source implant region may be formed through the conductive material of the source contact and into a portion of the doped semiconductive material. The source implant region is formulated so that surrounding materials are selectively etchable relative to the source implant region. A conductive liner material may, optionally, be formed over exposed surfaces of the doped semiconductive material and the source implant region, portions of which may be removed to expose the source implant region.

In contrast to conventional electronic devices, the electronic devices according to embodiments of the disclosure include the implant structure (e.g., the source implant region) within an upper portion of the source stack and laterally adjacent to the source contact. The source level conductive material may, optionally, laterally intervene between the implant structure and the source contact or, alternatively, opposing portions of dielectric materials of the slit structure may laterally intervene therebetween. The implant structure and adjacent materials provide additional process margin for etching materials of the electronic device and into a region of the source contact while protecting the source stack below the source contact. Since multiple poly-silicon materials are present, etching the multiple polysili-con materials may cause processing challenges, such as over-etching. The over-etching may, for example, lead to corrosion of conductive materials of the source stack. By including the implant structure laterally adjacent to the source contact and into the source stack of the electronic device, etching into and through the source contact is controllable. The implant structure protects underlying con-ductive materials of the source stack and decreases etching into the region of the source contact. By appropriately selecting a material of the implant structure, polysilicon materials of the electronic device may be selectively removed without exposing portions of the source stack beneath the implant structure to the removal conditions. By protecting the source stack, corrosion of conductive mate-rials of the source stack may be reduced or eliminated.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional electronic device fabrica-tion techniques employed in the industry. In addition, the description provided below does not form a complete pro-cess flow for manufacturing an electronic device (e.g., a memory device, such as 3D NAND Flash memory device). The structures described below do not form a complete electronic device. Only those process acts and structures necessary to understand the embodiments of the disclosure are described in detail below. Additional acts to form a complete electronic device from the structures may be performed by conventional fabrication techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-en-hanced CVD), or epitaxial growth. Alternatively, the mate-rials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or elec-tronic system. Variations from the shapes depicted in the drawings as a result, for example, of manufacturing tech-niques and/or tolerances, are to be expected. Thus, embodi-ments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combina-tions of one or more of the associated listed items.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depend-ing on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indi-rectly adjacent to (e.g., indirectly laterally adjacent to, indirectly vertically adjacent to), indirectly underneath, or near the other element, with other elements present therebe-tween. In contrast, when an element is referred to as being "directly on" or "directly adjacent to" another element, there are no intervening elements present.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 108.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "electronic device" includes, without limitation, a memory device, as well as a semiconductor device which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may, for example, be a 3D electronic device, such as a 3D NAND Flash memory device.

As used herein, the term "conductive material" means and includes an electrically conductive material. The conductive material may include one or more of a doped polysilicon, undoped polysilicon, a metal, an alloy, a conductive metal oxide, a conductive metal nitride, a conductive metal silicide, and a conductively doped semiconductor material. By way of example only, the conductive material may be one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), n-doped polysilicon, p-doped polysilicon, undoped polysilicon, and conductively doped silicon.

As used herein, a "conductive structure" means and includes a structure formed of and including one or more conductive materials.

As used herein, "insulative material" means and includes electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions.

As used herein, an "insulative structure" means and includes a structure formed of and including an insulative material.

As used herein, the terms "opening" and "slit" mean and include a volume extending through at least one structure or at least one material, leaving a void (e.g., gap) in that at least one structure or at least one material, or a volume extending between structures or materials, leaving a gap between the structures or materials. Unless otherwise described, an "opening" and/or "slit" is not necessarily empty of material. That is, an "opening" and/or "slit" is not necessarily void space. An "opening" and/or "slit" formed in or between structures or materials may comprise structure(s) or material(s) other than that in or between which the opening is formed. And, structure(s) or material(s) "exposed" within an "opening" and/or "slit" is (are) not necessarily in contact with an atmosphere or non-solid environment. Structure(s) or material(s) "exposed" within an "opening" and/or "slit" may be adjacent or in contact with other structure(s) or material(s) that is (are) disposed within the "opening" and/or "slit."

As used herein, the term "sacrificial," when used in reference to a material or structure, means and includes a material or structure that is formed during a fabrication process but which is removed (e.g., substantially removed) prior to completion of the fabrication process.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

As used herein, the terms "selectively removable" or "selectively etchable" mean and include a material that exhibits a greater etch rate responsive to exposure to a given etch chemistry and/or process conditions (collectively referred to as etch conditions) relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

Figure 1B:
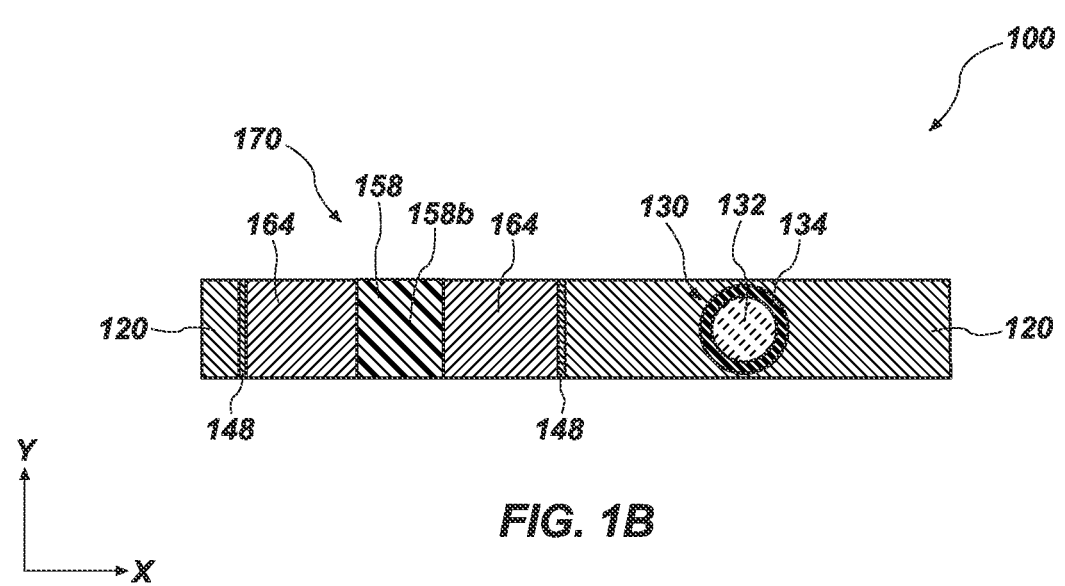
FIG. 1B is a simplified partial top-down view of the electronic device of FIG. 1A taken along the A-A line.

An electronic device 100 according to embodiments of the disclosure is shown in FIGS. 1A and 1B. The electronic device 100 includes a source stack 102 that includes one or more conductive materials, such as conductive material 104 (e.g., conductive liner material), source material 106, and a doped semiconductive material 108. The conductive material 104 is adjacent to (e.g., on) a base material (not shown), the source material 106 is adjacent to (e.g., vertically adjacent to, on) the conductive material 104, and the doped semiconductive material 108 is adjacent to (e.g., vertically adjacent to, on) the source material 106. A source contact 120 is adjacent to (e.g., vertically adjacent to, on) the source stack 102. A cap material 118 (e.g., a semiconductive cap material) is adjacent to (e.g., vertically adjacent to, on) the source contact 120. Optionally, one or more dielectric cap materials 122 may be adjacent to (e.g., vertically adjacent to, on) the cap material 118. One or more of the cap material 118, the source contact 120, and the doped semiconductive material 108 may, optionally, include an oxidized portion 148, as described in greater detail below.

An implant structure (e.g., source implant region 158) is present within an upper portion of the source stack 102 and laterally adjacent to the source contact 120. The source implant region 158 includes a lower portion 158a within an upper portion of the doped semiconductive material 108 and an upper portion 158b laterally adjacent to a lower portion of the source contact 120. The source implant region 158 is formulated to be resistant to removal under some etch conditions, so that additional dielectric and semiconductive (e.g., polysilicon) materials are selectively etchable relative to the source implant region 158. A source level conductive material 164 may, optionally, laterally intervene between the source implant region 158 (e.g., the upper portion 158b thereof) and the source contact 120, as shown in FIG. 1A. Alternatively, one or more dielectric materials of a slit structure may laterally intervene between the source implant region 158 and the source contact 120, as shown in the embodiment of an electronic device 100' of FIG. 2N.

Tiers 145 of alternating insulative materials 126 and conductive materials 166 are adjacent to (e.g., vertically adjacent to, on) the cap material 118. If present, the dielectric cap materials 122 may vertically intervene between the tiers 145 and the cap material 118. Some of the conductive materials 166 are configured as so-called "replacement gate" word lines (e.g., word lines formed by a so-called "replacement gate" or "gate late" process). One or more of the tiers 145 proximal to the cap material 118 functions as a select gate source (SGS) 146 and one or more of the tiers 145 distal to the cap material 118 functions as a select gate drain (SGD). The tiers 145 form a tier stack 141 adjacent to the cap material 118.

Pillars 130 (e.g., memory pillars) extend through the tiers 145, the cap material 118, the source contact 120, and at least partially into the doped semiconductive material 108. The pillars 130 include a fill material 132, a channel 134, a tunnel dielectric material 136, a charge trap material 138, and a charge blocking material 140. The tunnel dielectric material 136, the charge trap material 138, and the charge blocking material 140 may function as tunneling structures of the pillars 130 of the electronic device 100.

As shown in FIG. 1A, the source contact 120 (e.g., a lateral contact region, a conductive contact region) is in direct contact with a lower surface (e.g., a lower horizontal surface) of the cap material 118 and in direct contact with an upper surface of the doped semiconductive material 108. The source contact 120 is also in direct contact with a portion of the pillar 130, such as directly contacting upper horizontal surfaces and lower horizontal surfaces of the tunnel dielectric material 136, the charge trap material 138, and the charge blocking material 140 and directly contacting the channel 134. The tunnel dielectric material 136, the charge trap material 138, and the charge blocking material 140 of the pillar 130 are separated into discrete (e.g., discontinuous) portions that extend above and below the source contact 120, while the channel 134 and the fill material 132 extend substantially continuously an entire height of the pillars 130. However, the fill material 132 may, optionally, include an interior void. For example, the source contact 120 may segment portions of the tunnel dielectric material 136, the charge trap material 138, and the charge blocking material 140 from additional portions thereof. The source contact 120 is separated from (e.g., isolated from) a lowermost tier (e.g., the SGS 146) by the cap material 118 and, optionally, by the dielectric cap materials 122.

Figure 2A:
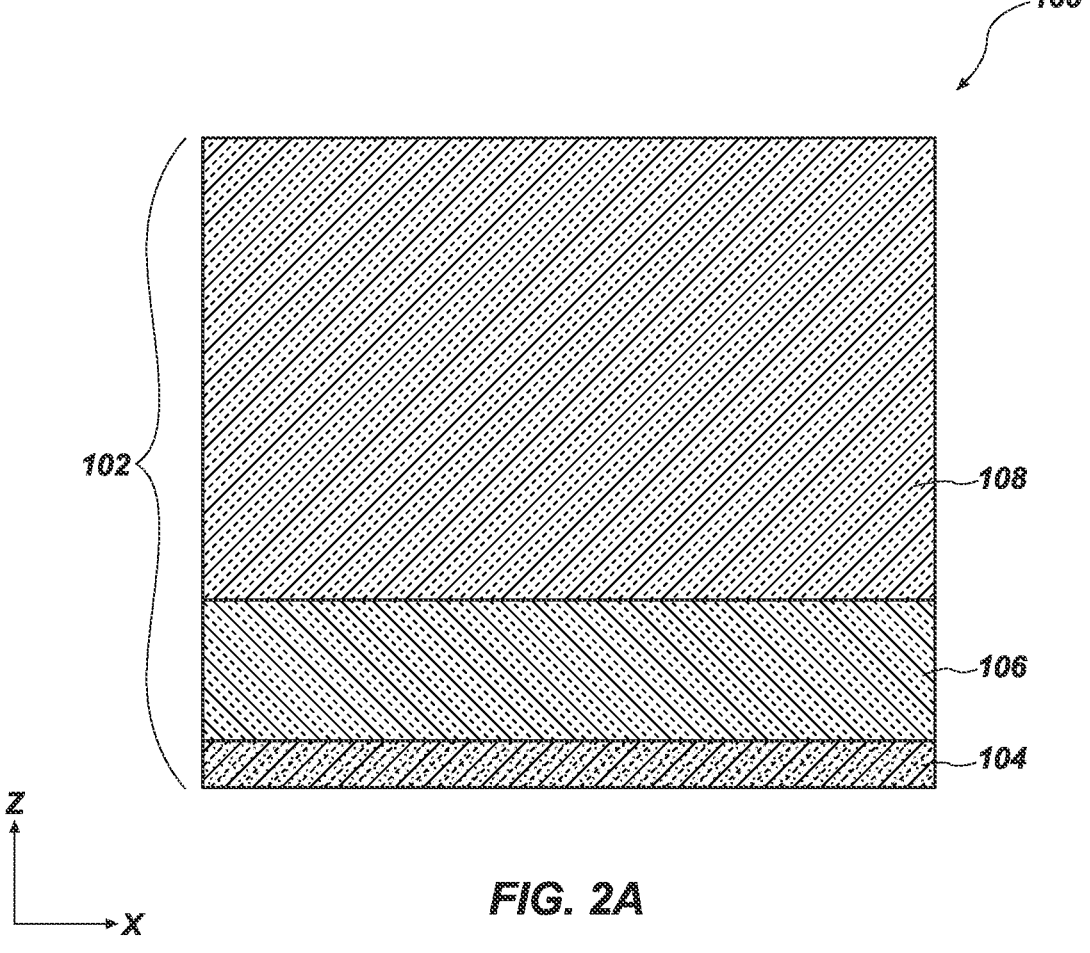
FIGS. 2A through 2N are simplified partial cross-sectional views illustrating a method of forming electronic devices in accordance with embodiments of the disclosure.
Figure 2B:
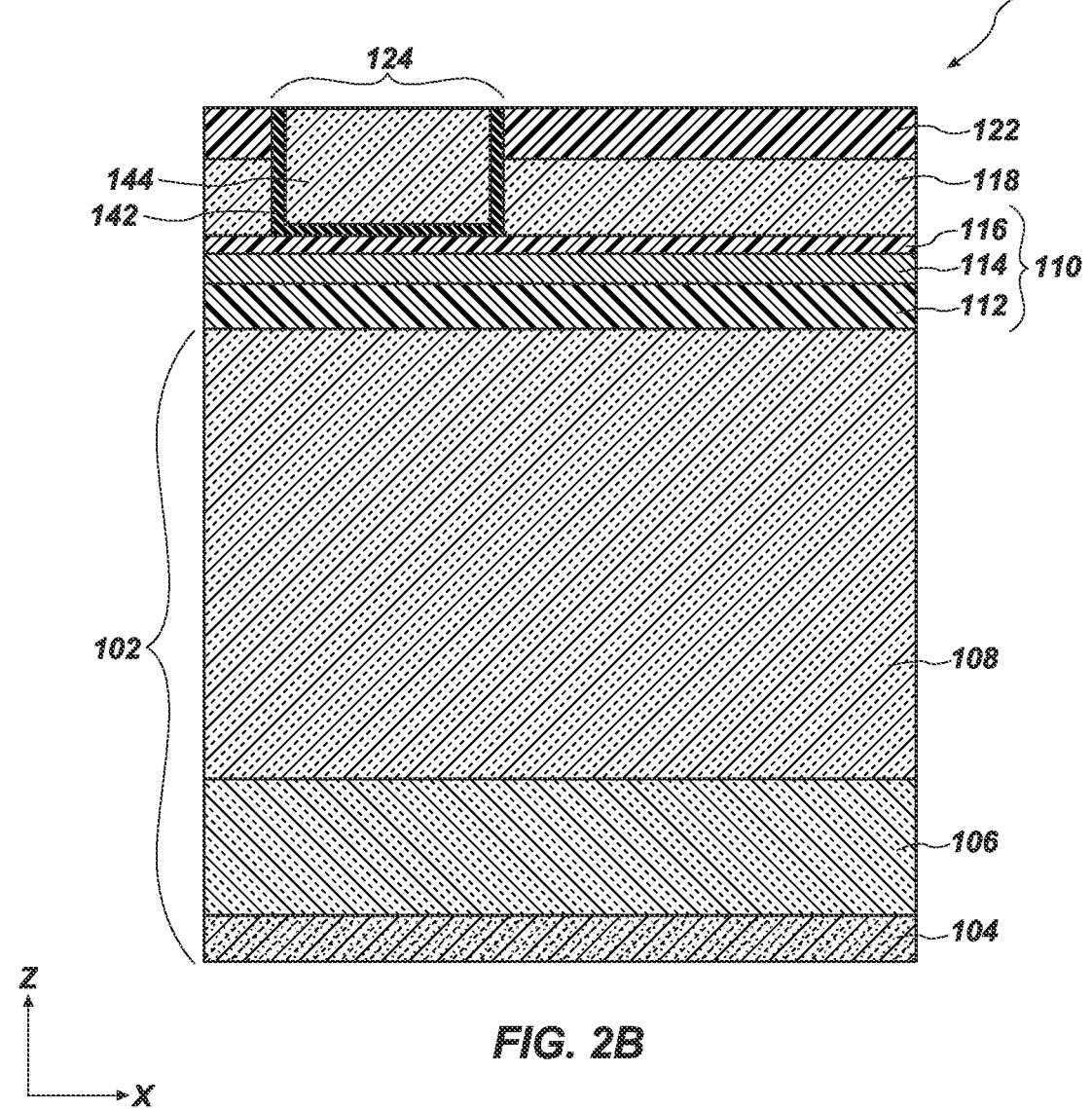
Figure 2C:
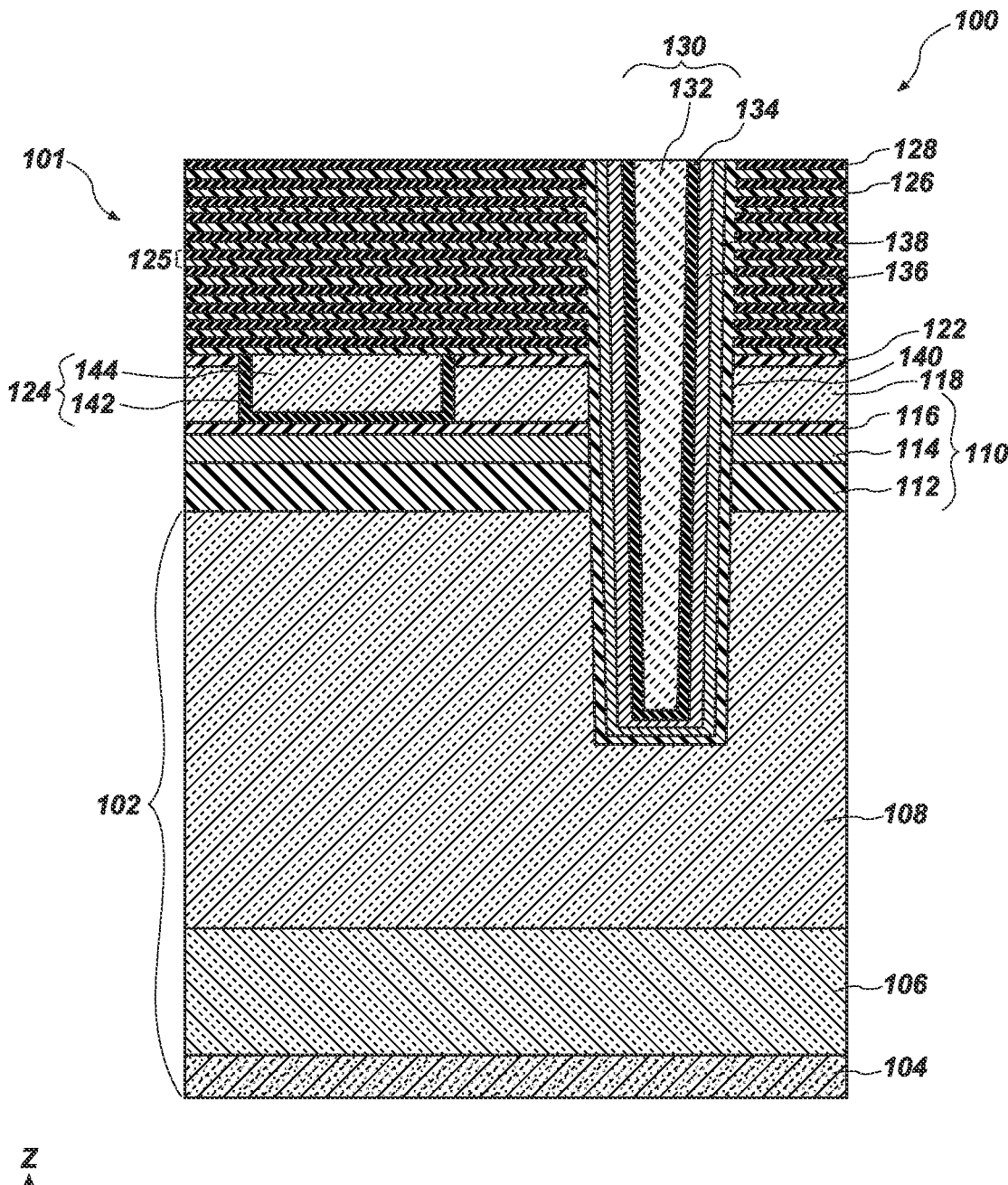
Figure 2D:
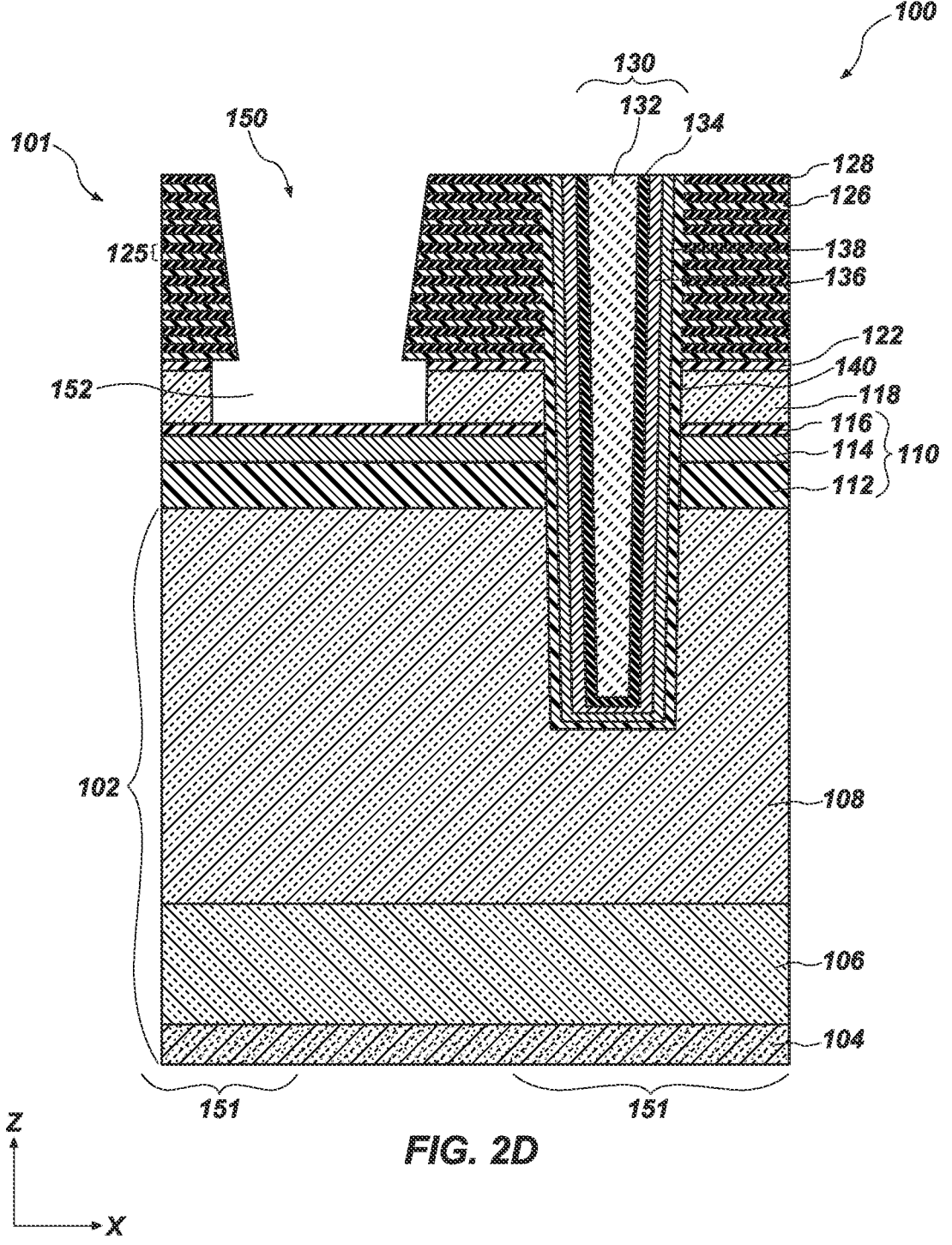

A slit structure 170 including a fill material 172 (e.g., one or more dielectric materials) may be present in the slit 150 (FIG. 2D). The upper portion 158b of the source implant region 158 and the source level conductive material 164 are located within the slit structure 170. The source implant region 158 is in vertical alignment with the fill material 172. The source level conductive material 164 may be in vertical alignment with the fill material 172 and laterally adjacent to (e.g., directly laterally adjacent to) the source implant region 158, as shown in FIG. 1A. Alternatively, opposing portions of the fill material 172 may be laterally adjacent to (e.g., directly laterally adjacent to) the source implant region 158, without the source level conductive material 164 being present in the slit structure 170, as shown in the embodiment of the electronic device 100' of FIG. 2N.

FIG. 1B is a simplified partial top-down view taken along the A-A line in FIG. 1A. At an elevational level of the lower portion of the source contact 120, the source contact 120 is in direct contact with side surfaces of the channel 134 of the pillar 130 in at least one horizontal direction (e.g., the X-direction, the Y-direction). The source contact 120 may be in direct contact with the source level conductive material 164, such that the oxidized portion 148 of the source contact 120 directly contacts the source level conductive material 164, as shown in FIG. 1B. The source implant region 158 (e.g., the upper portion 158b thereof) is in direct contact with and directly interposed between opposing portions of the source level conductive material 164. Accordingly, the source implant region 158 is separated from the source contact 120 by the source level conductive material 164 and optional oxidized portion 148 of the source contact 120. In additional embodiments, the source contact 120 is in direct contact with the fill material 172 (FIG. 1A) of the slit structure 170, and the source implant region 158 is in direct contact with and directly interposed between opposing portions of the fill material 172 (see FIG. 2N). An elongated portion of the source implant region 158 may extend in a horizontal direction (e.g., in the Y-direction) in which the slit structure 170 extends. The source implant region 158 is centrally located within a lower portion of the slit structure 170. In some embodiments, the source implant region 158 may extend continuously in the Y-direction. In other embodiments, the source implant region 158 may be separated into discrete portions, such that the slit structure 170 includes more than one (e.g., two or more) portions of the source implant region 158.

Figure 2E:
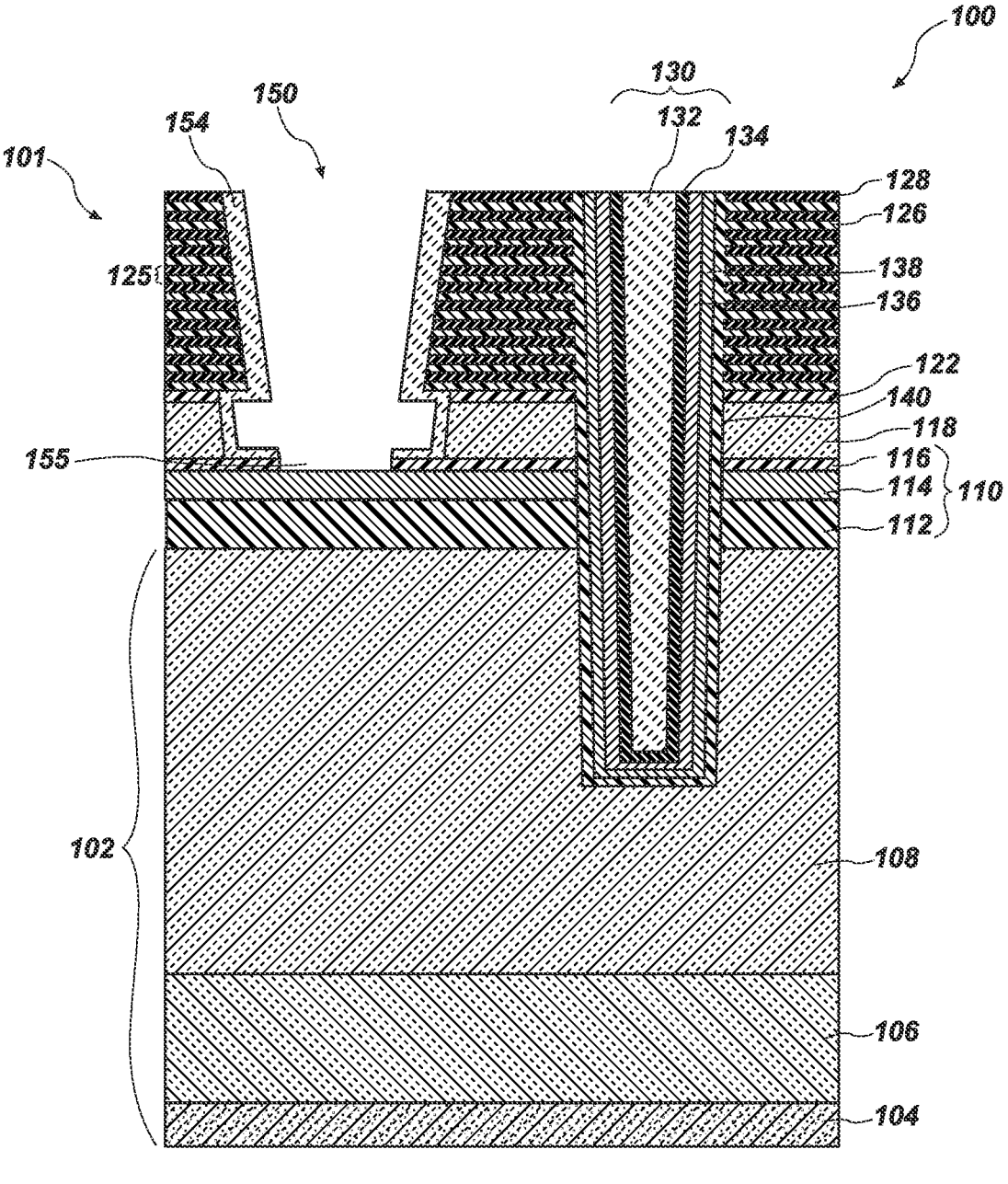
Figure 2F:
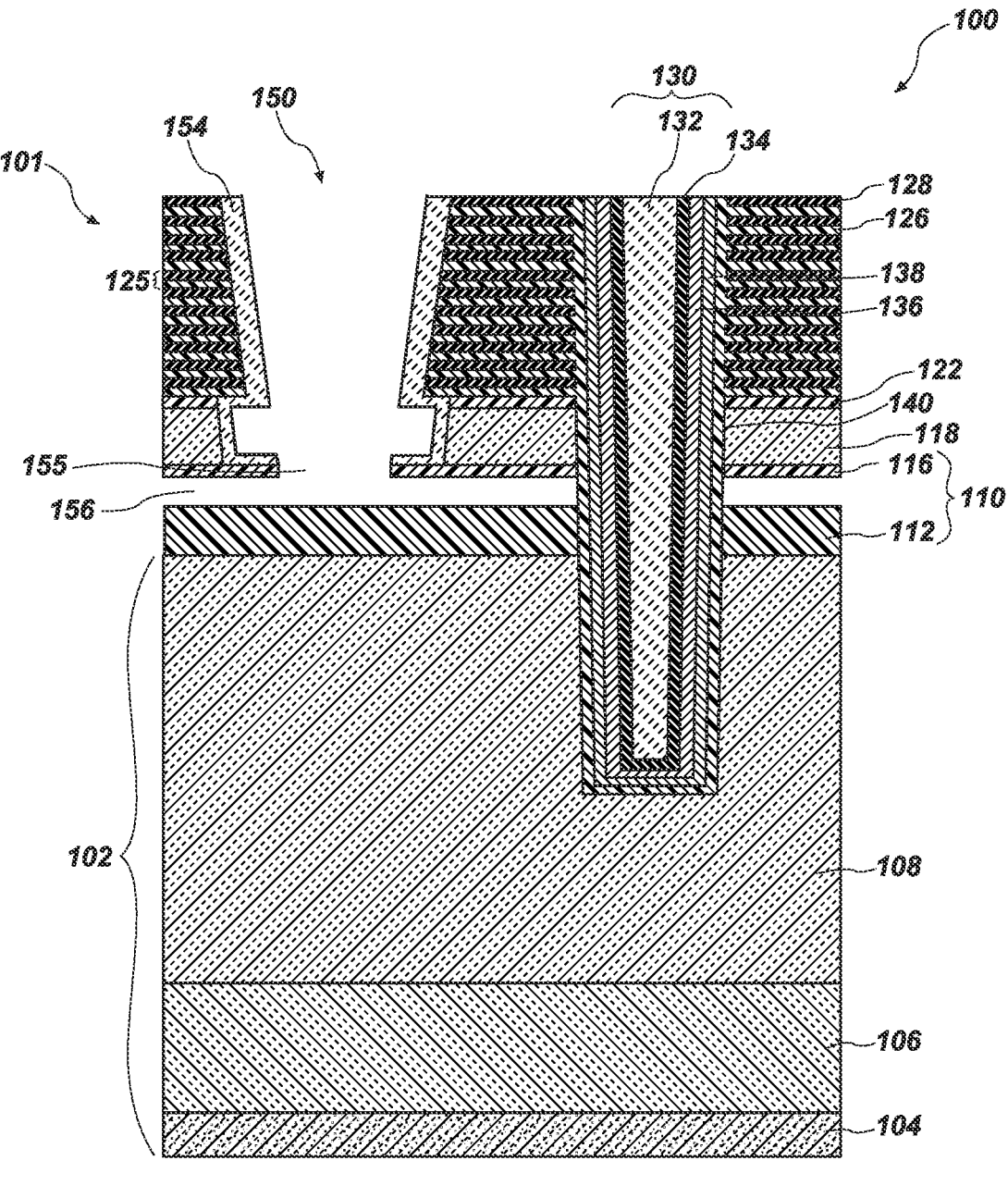
Figure 2G:
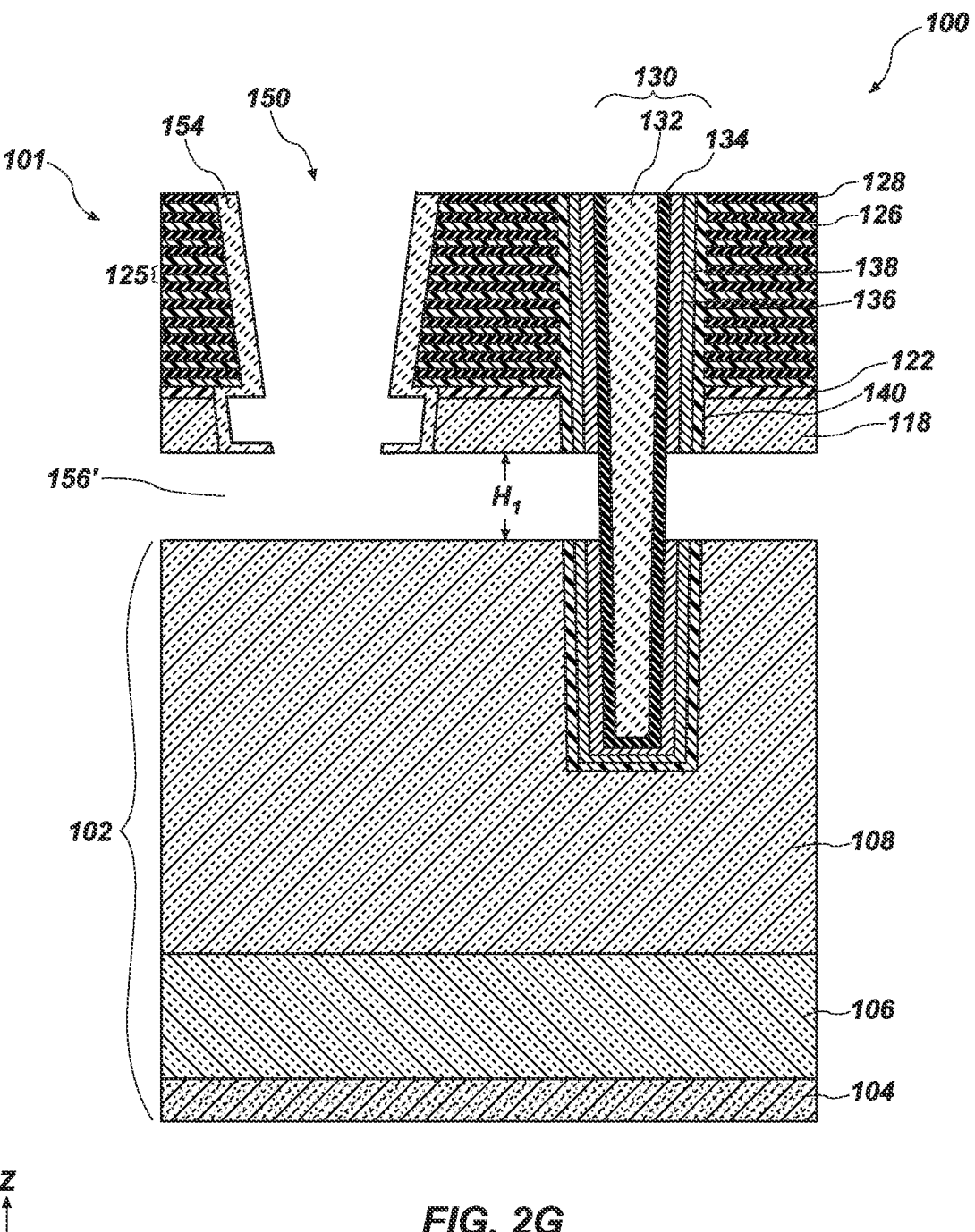
Figure 2H:
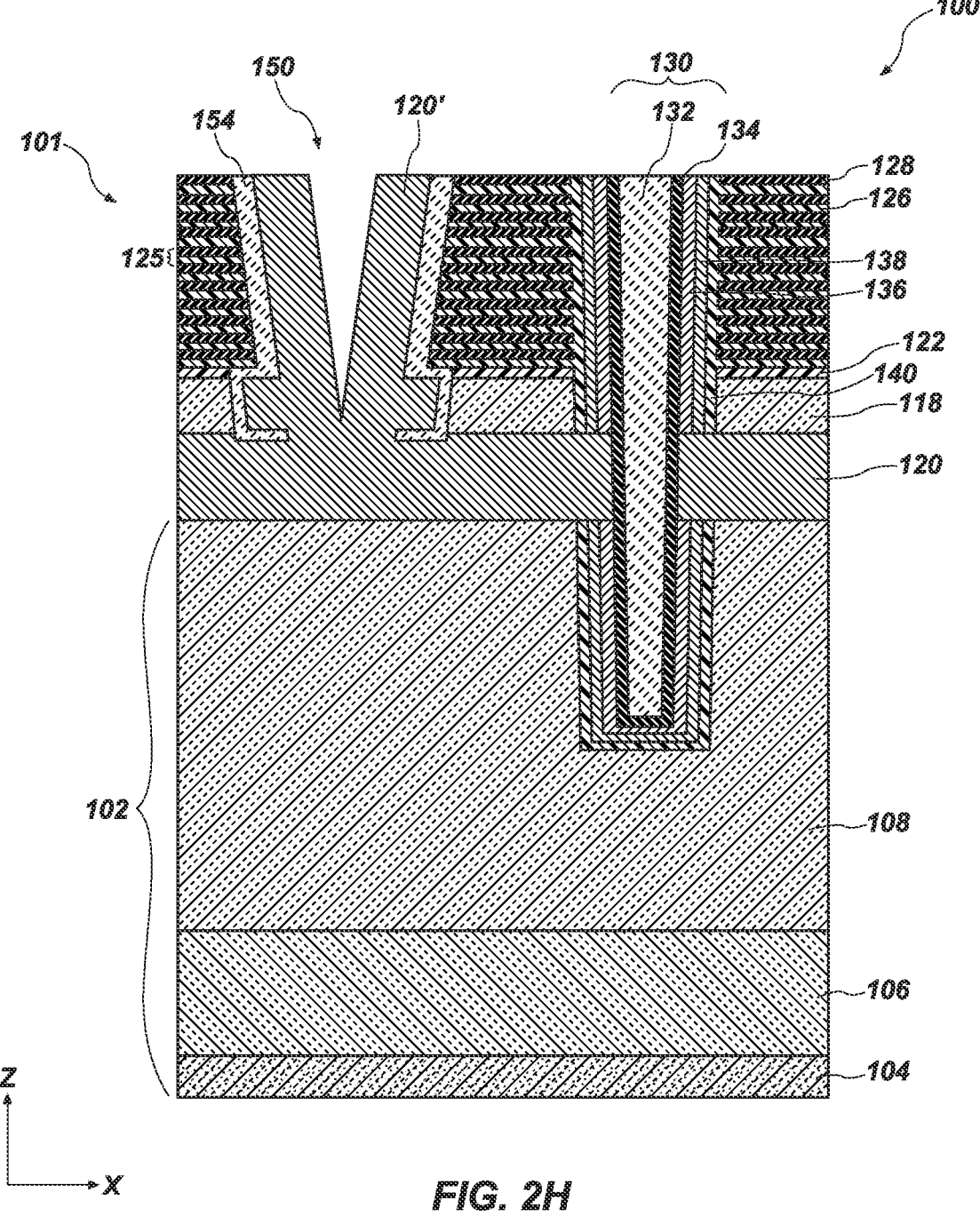
Figure 2I:
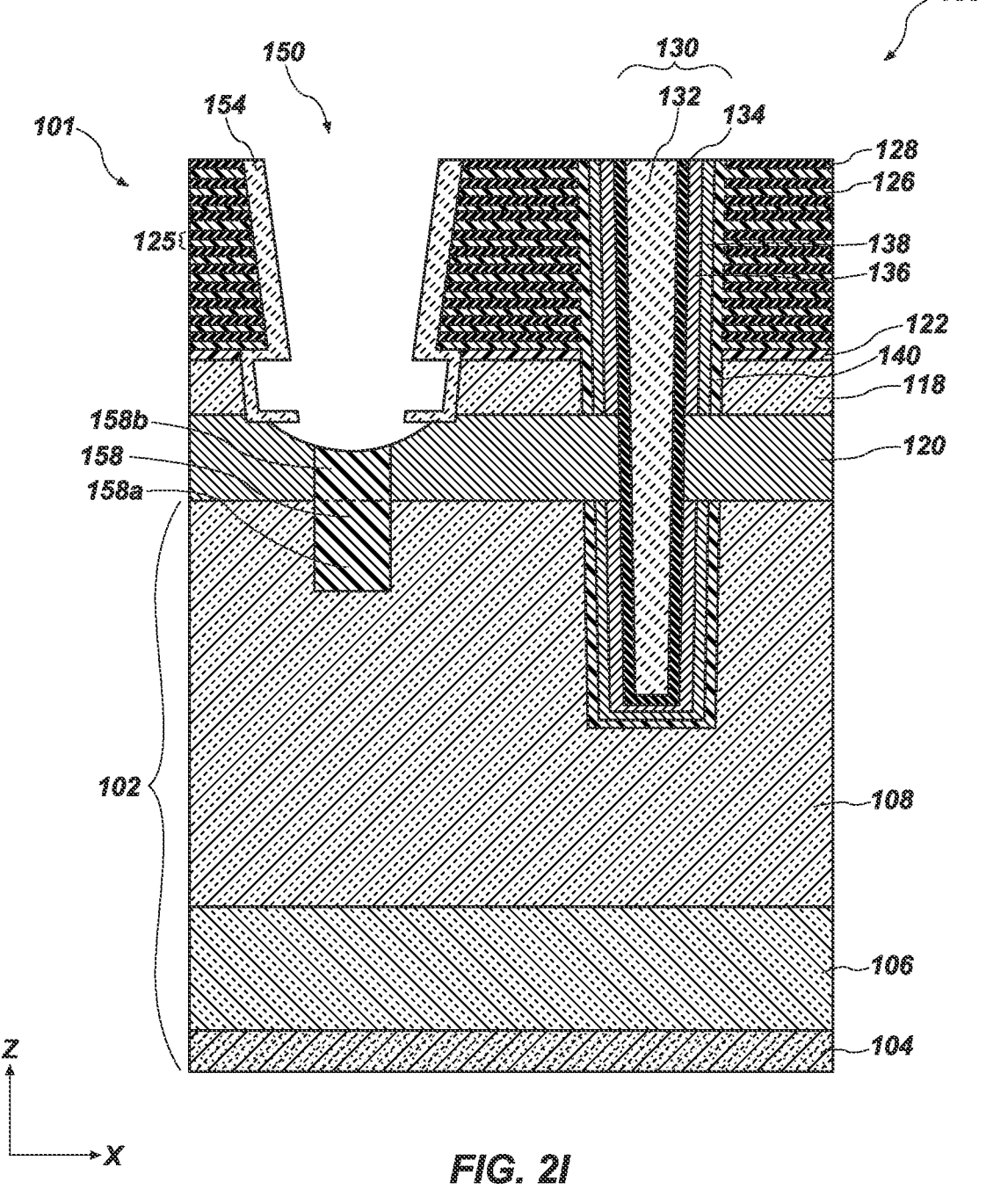
Figure 2J:
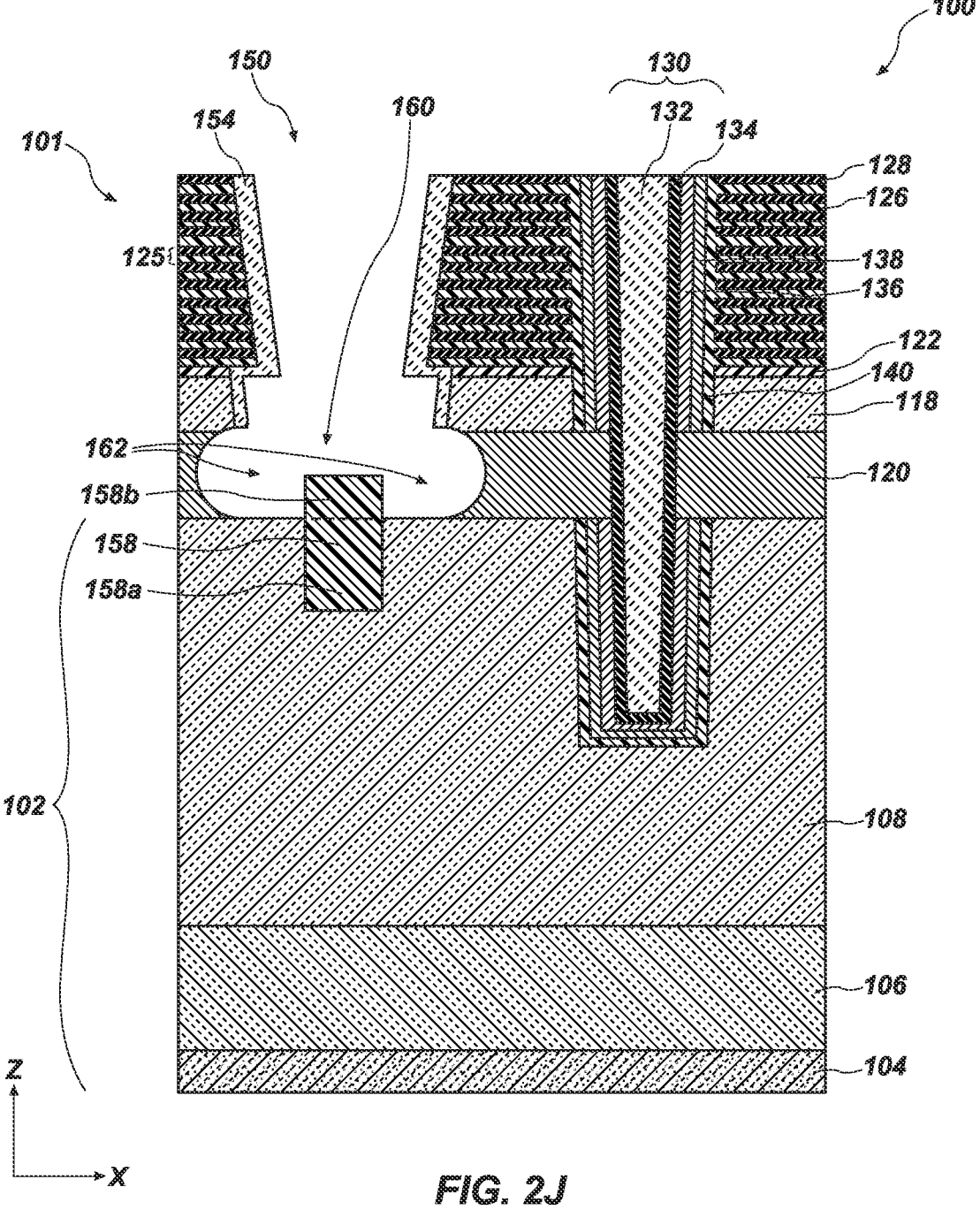
Figure 2K:
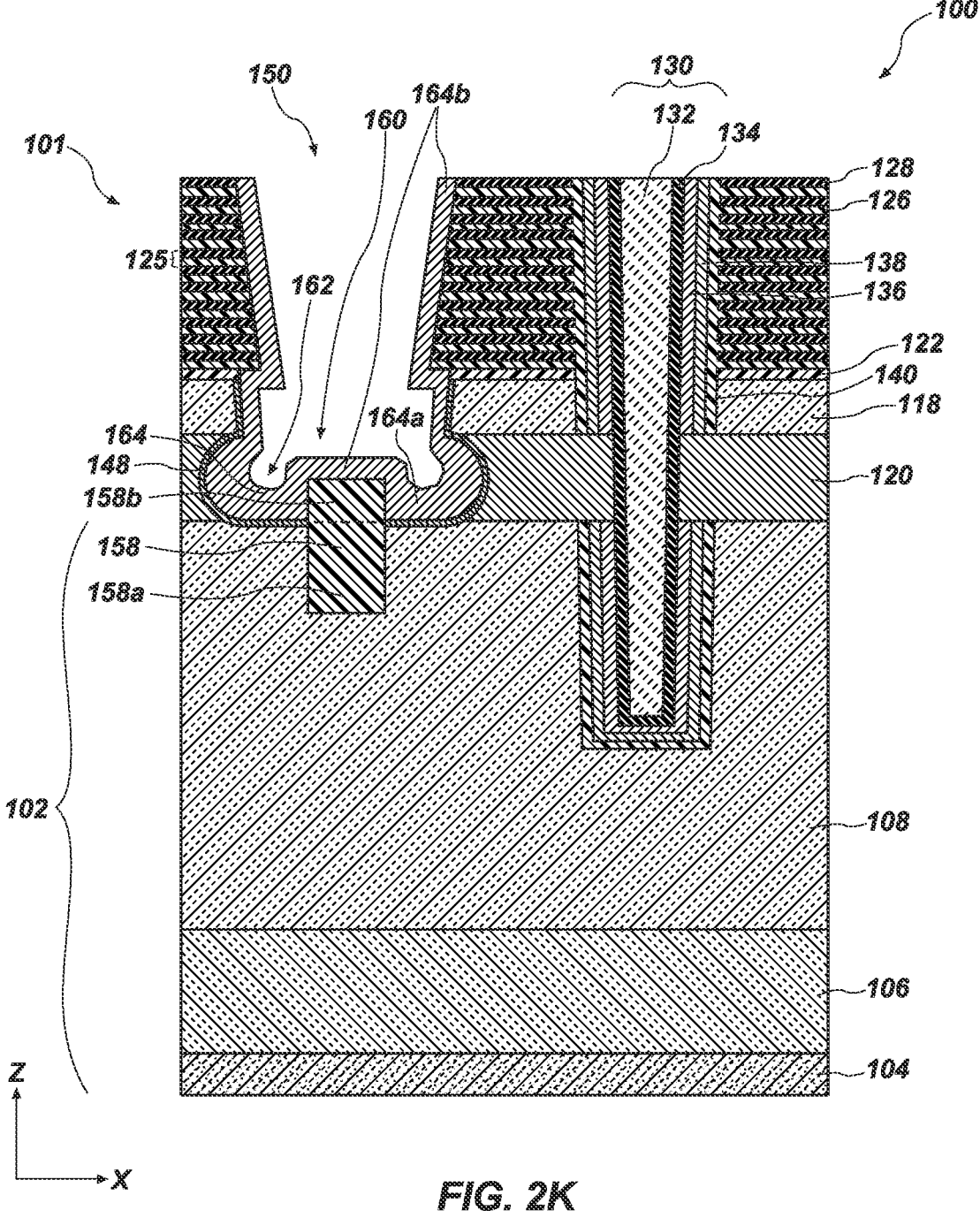
Figure 2L:
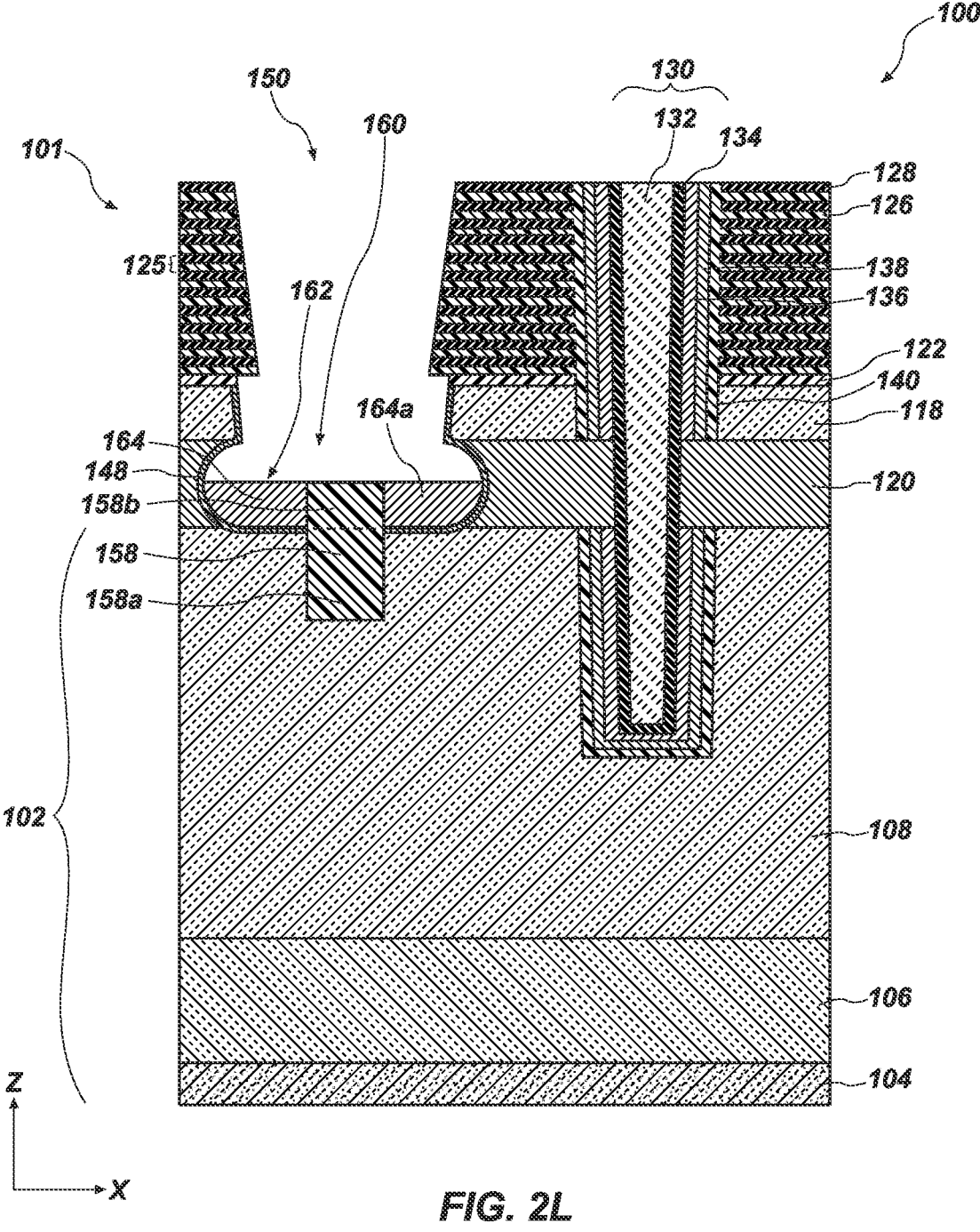
Figure 2M:
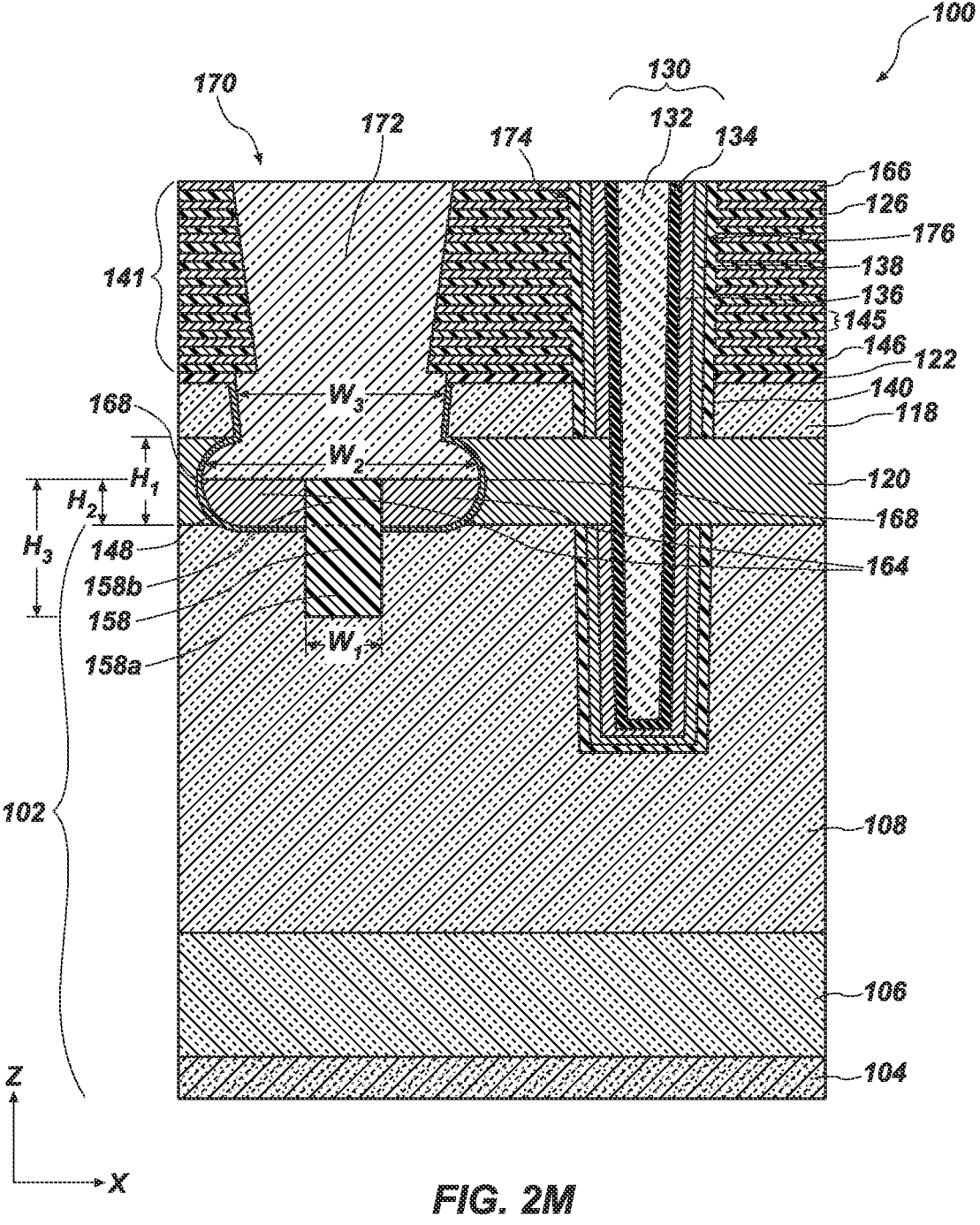
Figure 2N:
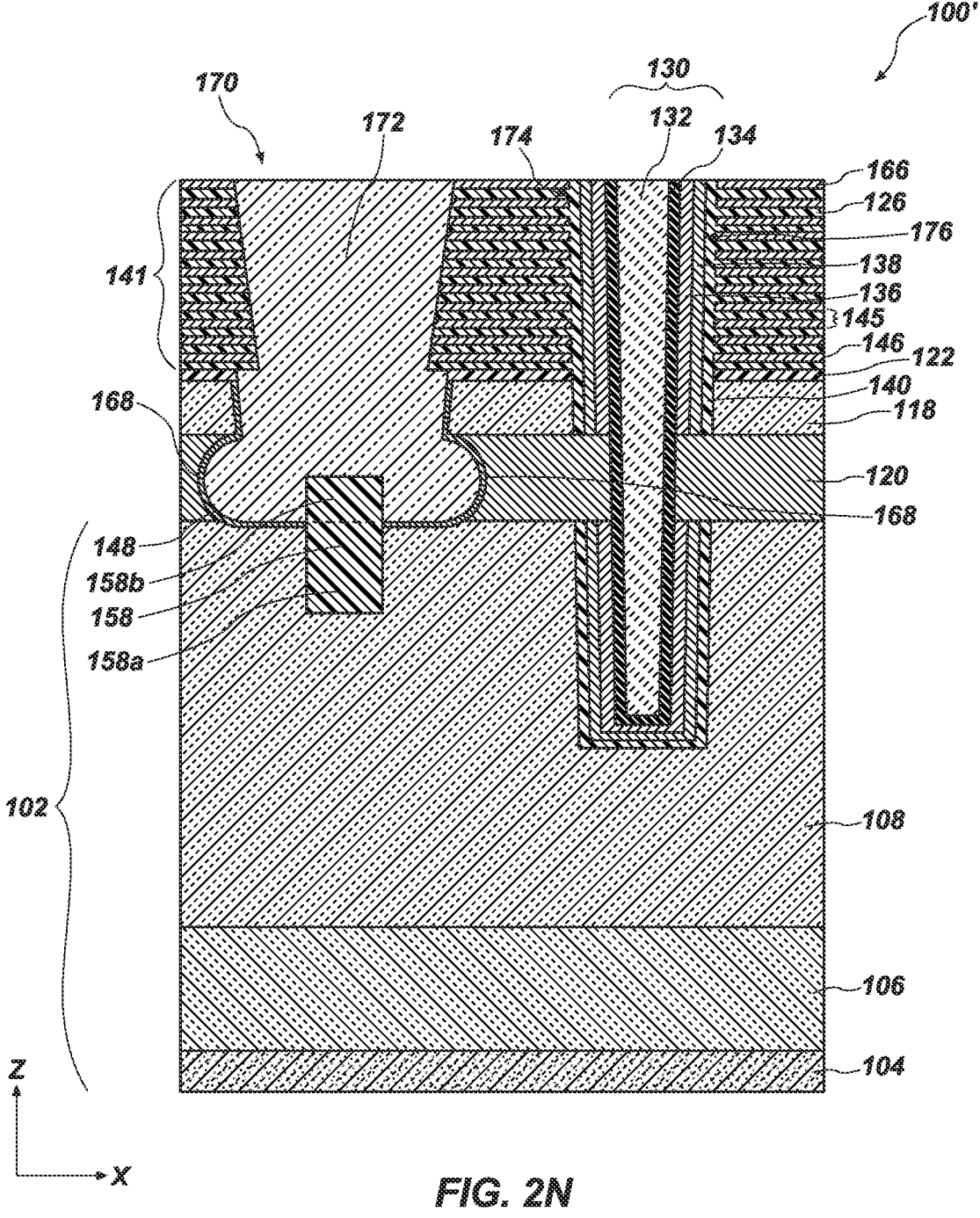

The electronic device 100 according to embodiments of the disclosure may be formed as illustrated in FIGS. 2A through 2M, and the electronic device 100' according to additional embodiments of the disclosure may be formed as illustrated in FIG. 2N. As shown in FIG. 2A, the source stack 102 (e.g., a source structure, a source region) of the electronic device 100 is formed adjacent to the base material (not shown) and includes one or more conductive materials, with the conductive material 104 formed adjacent to the base material, the source material 106 formed adjacent to the conductive material 104, and the doped semiconductive material 108 formed adjacent to the source material 106. In some embodiments, the conductive material 104 is formed of and includes titanium nitride, the source material 106 is formed of and includes tungsten silicide ($WSi_x$), and the doped semiconductive material 108 is formed of and includes a doped polysilicon material. However, the conductive material 104, the source material 106, and the doped semiconductive material 108 may be formed of and include other conductive materials. Each of the conductive material 104, source material 106, and doped semiconductive material 108 may be formed by conventional techniques and to a desired thickness. By way of example only, the conductive material 104 may be formed to a thickness of from about 200 angstroms (Å) to about 400 Å, the source material 106 may be formed to a thickness of from about 800 Å to about 1000 Å, and the doped semiconductive material 108 may be formed to a thickness of from about 2000 Å to about 4000 Å.

As shown in FIG. 2B, a source contact sacrificial structure 110 is formed over the source stack 102. The source contact sacrificial structure 110 may include a first sacrificial material 112, a second sacrificial material 114, and a third sacrificial material 116, each of which is formed by conventional techniques. Materials of the first sacrificial material 112, the second sacrificial material 114, and the third sacrificial material 116 may be selectively etchable relative to one another and relative to other materials of the electronic device 100. However, the first sacrificial material 112 and the third sacrificial material 116 may be the same material (e.g., the same chemical composition) or may be a different material (e.g., a different chemical composition). By way of example only, the first sacrificial material 112, the second sacrificial material 114, and the third sacrificial material 116 may be dielectric materials, such as a silicon oxide material or a silicon nitride material, that are selectively etchable. In some embodiments, the first sacrificial material 112 is a highly conformal silicon dioxide, the second sacrificial material 114 is silicon nitride, and the third sacrificial material 116 is tetraethylorthosilicate (TEOS). However, other combinations of dielectric materials may be used. In addition, the source contact sacrificial structure 110 may be formed of and include two materials or more than three materials. Removal of the source contact sacrificial structure 110 provides lateral access for the subsequently formed source contact 120 to contact the pillar 130.

A location of the source contact sacrificial structure 110 corresponds to the location at which the source contact 120 (FIG. 1A) is ultimately formed, and a total thickness of the as-formed source contact sacrificial structure 110 may be determined by a desired thickness of the source contact 120. Individual thicknesses of each of the first sacrificial material 112, the second sacrificial material 114, and the third sacrificial material 116 may be selected based on the desired thickness of the source contact 120. By way of example only, the first sacrificial material 112 may be formed to a thickness of from about 30 Å to about 400 Å, the second sacrificial material 114 may be formed to a thickness of from about 100 Å to about 300 Å, and the third sacrificial material 116 may be formed to a thickness of from about 30 Å to about 200 Å. The thickness of each of the first sacrificial material 112, the second sacrificial material 114, and the third sacrificial material 116 may be sufficient to protect cell film materials of the pillars 130 (FIG. 1A) and the source stack 102 during subsequently conducted process acts that provide access to the pillars 130 by sequentially removing portions of the cell films.

The cap material 118 (e.g., a cap region) is adjacent to the source contact sacrificial structure 110 and may be formed by conventional techniques. The cap material 118 may be formulated to prevent removal processes from removing portions of the insulative materials 126 during removal of the cell films. In some embodiments, the cap material 118 may be formed of and include a dielectric material that is resistant to etch conditions (e.g., etch chemistries and process conditions) used during subsequent process acts. In other embodiments, the cap material 118 may be formed of and include a doped polysilicon material. By way of example only, the cap material 118 may be resistant to phosphoric acid-based etch chemistries, to hydrogen fluoride (HF), or to other halogen-based etch chemistries.

A thickness of the cap material 118 may be from about 400 Å to about 1000 Å, such as from about 400 Å to about 600 Å, from about 450 Å to about 550 Å, from about 450 Å to about 700 Å, from about 500 Å to about 700 Å, from about 600 Å to about 800 Å, from about 700 Å to about 900 Å, or from about 800 Å to about 1000 Å. The thickness of the cap material 118 may be selected depending on a desired distance between the source contact 120 and the SGS 146 (FIG. 1A) of the tier stack 141 (see FIG. 1A). The thickness of the cap material 118 may be sufficient to separate (e.g., physically separate) the source contact 120 from the SGS 146 by a desired distance. The cap material 118 may also function as an etch stop material during subsequent process acts. In some embodiments, the thickness of the cap material 118 is about 500 Å. The one or more dielectric cap materials 122 (e.g., oxide cap materials) may be formed adjacent to (e.g., on) the cap material 118.

A slit sacrificial structure 124 may be formed in one or more cap materials (e.g., the dielectric cap materials 122, the cap material 118), as shown in FIG. 2B. For convenience, the dielectric cap materials 122 and the cap material 118 are collectively referred to hereinafter as the cap material 118. The slit sacrificial structure 124 may be formed of and include one or more materials that are selective etchable relative to the materials of tiers 125 (see FIG. 2C). The slit sacrificial structure 124 may also function as an etch stop during subsequent process acts. The slit sacrificial structure 124 may extend through the cap material 118 and, optionally, partially into or through the third sacrificial material 116 of the source contact sacrificial structure 110. A location of the slit sacrificial structure 124 corresponds to a location adjacent to which (e.g., over which) a slit 150 (see FIG. 2D) is subsequently formed. The slit sacrificial structure 124 may, for example, include one or more liner materials 142 and an etch stop material 144. By way of example only, the liner materials 142 may include one or more of a silicon oxide material and a titanium nitride material, and the etch stop material 144 may be tungsten or a tungsten-containing material. The etch stop material 144 may be configured as a plug. Alternatively, the slit sacrificial structure 124 may be formed of a single material, such as aluminum oxide, two materials, or more than three materials as long as the material(s) provide the desired etch selectivity and etch stop functions. For example, in embodiments including a dielectric material of the cap material 118, the slit sacrificial structure 124 may include the etch stop material 144, without including the liner materials 142. Excess portions of the slit sacrificial structure 124 may be removed (e.g., through a CMP process). In some embodiments, the dielectric cap materials 122 may be at least partially (e.g., entirely)

removed such that the cap material 118 is exposed. Additional portions of dielectric materials, collectively referred to herein as the dielectric cap materials 122, may, optionally, be formed over upper surfaces of the slit sacrificial structure 124 and the cap material 118. Alternatively, a lowermost one of the insulative materials 126 (FIG. 2C) may be formed directly adjacent to (e.g., directly on) the cap material 118 and the slit sacrificial structure 124.

As shown in FIG. 2C, the tiers 125 of alternating insulative materials 126 (e.g., insulative structures) and additional insulative materials 128 (e.g., additional insulative structures) are formed adjacent to (e.g., on) the slit sacrificial structure 124 and the cap material 118. The tiers 125 may be formed by conventional techniques. The pillar 130 of materials may be formed to vertically extend (e.g., in the Z-direction) through the tiers 125 of a tier stack 101, the cap material 118, and the source contact sacrificial structure 110, and at least partially into the doped semiconductive material 108. The materials of the pillar 130 may be configured and formulated to form memory cells of a memory device following subsequent processing of the electronic device 100. Materials of the pillar 130 may be formed within a pillar opening (not shown) and adjacent to exposed surfaces of the tiers 125, the cap material 118, the source contact sacrificial structure 110, and the doped semiconductive material 108. The lower portion of the pillar 130 may extend within the doped semiconductive material 108 to a depth within a range of from about 1000 Å to about 4000 Å from the upper surface of the doped semiconductive material 108. For example, the depth of the lower portion of the pillar 130 may extend from about 1000 Å to about 3500 Å, from about 1000 Å to about 3000 Å, or from about 1000 Å to about 2500 Å from the upper surface of the doped semiconductive material 108. While FIG. 2C illustrates the pillar 130 as extending partially into the doped semiconductive material 108, the pillar 130 may extend through the doped semiconductive material 108 and contact the source material 106.

The pillar 130 may be formed to include cell films, as shown in FIG. 2C. The charge blocking material 140, the charge trap material 138, the tunnel dielectric material 136, and the channel 134 may be conformally formed by conventional techniques. The fill material 132 may be formed adjacent to the channel 134 by conventional techniques. One or more voids may be present in the interior of the fill material 132. The charge blocking material 140, the charge trap material 138, the tunnel dielectric material 136, the channel 134, and the fill material 132 are positioned in order from the outermost material to the innermost material relative to an axial centerline of the pillar 130.

The charge blocking material 140 may be formed of and include a dielectric material. By way of example only, the charge blocking material 140 may be one or more of an oxide (e.g., silicon dioxide), a nitride (silicon nitride), and an oxynitride (silicon oxynitride), or another material. In some embodiments, the charge blocking material 140 is silicon dioxide.

The charge trap material 138 may be formed of and include at least one memory material and/or one or more conductive materials. The charge trap material 138 may be formed of and include one or more of silicon nitride, silicon oxynitride, polysilicon (doped polysilicon), a conductive material (e.g., tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material (e.g., polycrystalline or amorphous semiconductor material, including at least one elemental semiconductor element and/or including at least one compound semiconductor material, such as conductive nanoparticles (e.g., ruthenium nanoparticles) and/or metal dots). In some embodiments, the charge trap material 138 is silicon nitride.

The tunnel dielectric material 136 may include one or more dielectric materials, such as one or more of a silicon nitride material or a silicon oxide material. In some embodiments, the tunnel dielectric material 136 is a so-called "ONO" structure that includes silicon dioxide, silicon nitride, and silicon dioxide.

The channel 134 may be formed of and include a semiconductive material, a non-silicon channel material, or other channel material. The material of the channel may include, but is not limited to, a polysilicon material (e.g., polycrystalline silicon), a III-V compound semiconductive material, a II-VI compound semiconductive material, an organic semiconductive material, GaAs, InP, GaP, GaN, an oxide semiconductive material, or a combination thereof. In some embodiments, the channel 134 is polysilicon, such as a doped polysilicon. The channel 134 may be configured as a so-called doped hollow channel (DHC) or other configuration. The fill material 132 may be a dielectric material, such as silicon dioxide.

Referring to FIG. 2D, a portion of the tiers 125 and the slit sacrificial structure 124 (FIG. 2C) may be removed to form the slit 150 (e.g., slot, replacement gate slot) through the tiers 125 and a lower opening 152 in the cap material 118, exposing the source contact sacrificial structure 110. The tiers 125 and the slit sacrificial structure 124 may be removed by one or more etch processes, such as by using conventional etch conditions. The liner materials 142 and the etch stop material 144 of the slit sacrificial structure 124 may be substantially completely removed. Alternatively, portions of the liner materials 142 and the etch stop material 144 may remain adjacent to the cap material 118. If a single etch process is conducted, the tiers 125 and the slit sacrificial structure 124 may be substantially removed by the single etch process. If more than one etch process is conducted, the etch stop material 144 of the slit sacrificial structure 124 may function as an etch stop during the first etch process to form the slit 150 and a second etch process may be subsequently conducted to remove the slit sacrificial structure 124. For convenience, the slit 150 and the lower opening 152 are collectively referred to hereinafter as the slit 150. While FIG. 2D illustrates the slit 150 as extending through the tiers 125 and the cap material 118 to an upper surface of the third sacrificial material 116, the slit 150 may extend partially into or, alternatively, through the third sacrificial material 116.

The slit 150 may divide the tier stack 101 into multiple blocks 151. The blocks 151 may each extend in substantially the same horizontal direction (e.g., the Y-direction (FIG. 1B)) as one another, and neighboring blocks 151 may be horizontally separated (e.g., in the X-direction) from one another by the slit 150. Each of the blocks 151 may exhibit substantially the same geometric configuration (e.g., dimensions, shape) as each other of the blocks 151. In addition, horizontally neighboring blocks 151 may all be horizontally separated from one another by substantially the same distance (e.g., corresponding to a width of the slit 150 in the X-direction). Accordingly, the blocks 151 may be substantially uniformly (e.g., non-variably, equally, consistently) sized, shaped, and spaced relative to one another. While only one pillar 130 is shown within one of the blocks 151 in FIG. 2D for clarity, the disclosure is not so limited, and the blocks 151 may include any number of the pillars 130.

As shown in FIG. 2E, a slit liner 154 (e.g., a liner material) is formed on exposed surfaces of the tiers 125, the cap material 118, and the third sacrificial material 116 in the slit 150. The slit liner 154 may be conformally formed by conventional techniques such that a portion of the slit 150 remains open (e.g., unoccupied). The slit liner 154 may be formed of and include one or more dielectric materials, semiconductive materials, or conductive materials. In some embodiments, the slit liner 154 is undoped polysilicon. In other embodiments, the slit liner 154 is configured as a nitride-oxide-nitride (NON) material, so long as the materials of the slit liner 154 exhibit etch selectivity relative to surrounding materials. The slit liner 154 may be formed to a thickness of from about 200 Å to about 400 Å. A portion of the slit liner 154 is removed from a bottom surface of the slit 150, exposing the third sacrificial material 116 of the source contact sacrificial structure 110, which is also removed to form recess 155 in the third sacrificial material 116. The slit liner 154 and the third sacrificial material 116 at the bottom surface of the slit 150 may be removed by conventional techniques.

To provide access to the pillars 130, the source contact sacrificial structure 110 and portions of the cell films (charge blocking material 140, charge trap material 138, tunnel dielectric material 136) are sequentially removed, as shown in FIGS. 2F and 2G. The source contact sacrificial structure 110 is removed while a majority of the cap material 118 remains intact by selecting the etch conditions used to remove the source contact sacrificial structure 110. In other words, the cap material 118 is substantially resistant to the etch conditions used to remove the source contact sacrificial structure 110. In some embodiments, the cap material 118 is carbon-doped silicon nitride, and silicon dioxide of the source contact sacrificial structure 110 and silicon dioxide of the pillars 130 are selectively etchable relative to the cap material 118. The second sacrificial material 114 is removed through the slit 150 to expose an upper surface of the first sacrificial material 112, as shown in FIG. 2F, and a first source contact opening 156 is formed. As described below, the size of the first source contact opening 156 is sequentially increased to provide access to the pillars 130 following the removal of the source contact sacrificial structure 110.

As shown in FIG. 2F, the second sacrificial material 114 of the source contact sacrificial structure 110 is selectively removed without substantially removing the first and third sacrificial materials 112, 116 or the charge blocking material 140. The second sacrificial material 114 may be selectively etched by conventional techniques, such as by conventional etch conditions, which are selected depending on the chemical composition of the second sacrificial material 114. Since the first sacrificial material 112, the third sacrificial material 116, and the charge blocking material 140 may be similar materials and exhibit slower etch rates than the etch rate of the second sacrificial material 114, the second sacrificial material 114 is substantially removed relative to the first sacrificial material 112, the third sacrificial material 116, and the charge blocking material 140.

As shown in FIG. 2G, remaining portions of the third sacrificial material 116 and the first sacrificial material 112 of the source contact sacrificial structure 110 (FIG. 2F), as well as portions of the cell films of the pillar 130, may be removed through the slit 150. For example, exposed portions of the charge blocking material 140 and the third sacrificial material 116 are selectively removed without substantially removing the slit liner 154. The third sacrificial material 116 may be substantially completely removed while the exposed portion of the charge blocking material 140, adjacent (e.g., laterally adjacent) to the first source contact opening 156, is removed. In addition, the first sacrificial material 112 may be substantially completely removed while the third sacrificial material 116 and the charge blocking material 140 are removed. Alternatively, the first sacrificial material 112 may be removed in one or more material removal processes following removal of the third sacrificial material 116, the charge blocking material 140, and one or more additional cells films (e.g., the charge trap material 138, the tunnel dielectric material 136) of the pillar 130.

Removing the first sacrificial material 112 and the third sacrificial material 116 increases the size of the first source contact opening 156 (FIG. 2F), forming first source contact opening 156'. The exposed portion of the charge trap material 138 is then selectively removed without substantially removing the slit liner 154. The portion of the charge trap material 138 laterally adjacent to the first source contact opening 156' is removed by selectively etching the charge trap material 138, which exposes a portion of the tunnel dielectric material 136.

The exposed portion of the tunnel dielectric material 136 is then selectively removed. The portion of the tunnel dielectric material 136 laterally adjacent to the first source contact opening 156' is removed by selectively etching the tunnel dielectric material 136 relative to the cap material 118. Removing the tunnel dielectric material 136 also exposes a portion of the channel 134. During material removal processes through the slit 150, additional sacrificial materials (e.g., sacrificial liners) (not shown) may, optionally, be formed to protect surrounding materials during respective material removal processes, which sacrificial materials may be subsequently removed through the slit 150. The exposed portion of the channel 134 may ultimately be in contact with the source contact 120 (see FIGS. 1A and 1B).

Forming the first source contact opening 156' also exposes the lower surface of the cap material 118. The lower surface of the cap material 118 may be substantially coplanar with a lower surface (e.g., a lower horizontal surface) of the slit liner 154, as well as lower surfaces of each of the charge blocking material 140, the charge trap material 138, and the tunnel dielectric material 136. The cap material 118 may function as an offset between the source stack 102 and the tiers 125 of the tier stack 101 during the fabrication of the electronic device 100.

As shown in FIG. 2G, forming the first source contact opening 156' also exposes the upper surface of the doped semiconductive material 108. Since the first sacrificial material 112, the second sacrificial material 114, and the third sacrificial material 116 of the source contact sacrificial structure 110 (see FIG. 2F) provide protection to (e.g., masking of) various materials during the process acts indicated in FIGS. 2D through 2F, the initial thicknesses of the first sacrificial material 112, the second sacrificial material 114, and the third sacrificial material 116 are selected to be sufficiently thick to survive the etch conditions used to provide lateral access to the channel 134 of the pillars 130. The first source contact opening 156' exhibits a height $H_1$, which corresponds to a thickness of the source contact 120 (FIG. 1A) ultimately formed in the first source contact opening 156'. The thickness of the source contact 120 is greater than or equal to a combined thickness of the materials of the as-formed source contact sacrificial structure 110. By determining the desired thickness of the source contact 120, the thickness of the source contact sacrificial structure 110 may be selected. By way of non-limiting example, the height $H_1$ of the first source contact opening 156' may be within a range of from about 160 Å to about 2000 Å.

While the first sacrificial material 112, the second sacrificial material 114, and the third sacrificial material 116 have been removed (e.g., are not present) in the perspective of FIG. 2G, these materials of the source contact sacrificial structure 110 (see FIG. 2F) may be present in other portions (not shown) of the electronic device 100, such as in portions of the electronic device 100 distal to the slit 150. The source contact sacrificial structure 110 may be present (e.g., visible), for example, in peripheral regions of the electronic device 100. In other words, the source contact sacrificial structure 110 may be positioned between the doped semiconductive material 108 and the cap material 118 in the other portions of the electronic device 100. Therefore, although the source contact 120 is present between the cap material 118 and the source stack 102 of the electronic device 100 in the perspective shown in FIG. 1A, the other portions of the electronic device 100 will include the source contact sacrificial structure 110 between the cap material 118 and the source stack 102.

The first source contact opening 156' may provide access (e.g., lateral access) to the pillars 130 following the substantially complete removal of the source contact sacrificial structure 110 (FIG. 2F), which exposes the cell films of the pillar 130 including the channel 134. While FIG. 2G illustrates the exposed horizontal surfaces of the tunnel dielectric material 136, the charge trap material 138, and the charge blocking material 140 proximal to the cap material 118 as being substantially coplanar with each other and with the exposed horizontal surfaces of the cap material 118, the exposed horizontal surfaces of the charge trap material 138 may be recessed relative to the exposed horizontal surfaces of one or more of the tunnel dielectric material 136 and the charge blocking material 140 depending on the etch conditions used. For example, the exposed horizontal surfaces of the charge trap material 138 may be recessed to a point intermediate that of the exposed horizontal surfaces of the charge blocking material 140 and the tunnel dielectric material 136. The exposed horizontal surfaces of the tunnel dielectric material 136 may also be recessed relative to the exposed horizontal surfaces of the cap material 118 and of the charge trap material 138. Therefore, the size of the first source contact opening 156' may be further increased proximal to the pillars 130.

As shown in FIG. 2H, a conductive material 120' of the source contact 120 is formed within the first source contact opening 156' (FIG. 2G). The conductive material 120' may be conformally formed in the first source contact opening 156', substantially completely filling the first source contact opening 156' and filling a portion of the slit 150. In some embodiments, the conductive material 120' is polysilicon, such as N⁺ doped polysilicon. The conductive material 120' may be formed at a thickness of from about 150 Å to about 2000 Å, such as from about 160 Å to about 300 Å, from about 300 Å to about 500 Å, from about 500 Å to about 800 Å, from about 800 Å to about 1200 Å, from about 1200 Å to about 1500 Å, from about 1500 Å to about 1800 Å, or from about 1800 Å to about 2000 Å. The conductive material 120' extends in a horizontal direction between the cap material 118 and the doped semiconductive material 108 and contacts the pillar 130. An oxidation act may be conducted to activate dopants in the conductive material 120' so that the conductive material 120' is substantially continuous and includes few holes, voids, or a seam.

As shown in FIG. 2I, the conductive material 120' (FIG. 2H) is removed from the slit 150 while the conductive material 120' remains in the first source contact opening 156' (FIG. 2G), which forms the source contact 120. The conductive material 120' may be removed from the slit 150 without substantially removing the conductive material 120' from the first source contact opening 156'. In some embodiments, a portion of the conductive material 120' proximal the slit 150 may be removed, slightly recessing the source contact 120 adjacent to (e.g., under) the slit 150. In other embodiments, the source contact 120 adjacent to the slit 150 may not be recessed such that the upper surface of the source contact 120 is substantially planar. The conductive material 120' is removed by conventional techniques. The resulting source contact 120 extends in a horizontal direction between the cap material 118 and the doped semiconductive material 108 and contacts (e.g., directly contacts) the channel 134, the tunnel dielectric material 136, the charge trap material 138, and the charge blocking material 140 of the pillars 130. For example, the source contact 120 directly contacts upper and lower horizontal surfaces of the tunnel dielectric material 136, the charge trap material 138, and the charge blocking material 140 and side surfaces of the channel 134. The source contact 120 may include a substantially continuous portion of the conductive material 120' extending laterally adjacent to and substantially surrounding the channel 134 of the pillar 130.

Following formation of the source contact 120, the source implant region 158 (e.g., a source implant structure) may be formed to extend through the source contact 120 and into the doped semiconductive material 108 of the source stack 102. For example, the source implant region 158 (e.g., the lower portion 158a thereof) may be formed within an upper portion of the doped semiconductive material 108, which is isolated from the source material 106 by a lower portion of the doped semiconductive material 108. The source implant region 158 is laterally adjacent to a lower portion of the pillar 130 within the doped semiconductive material 108 of the source stack 102. The doped semiconductive material 108 of the source stack 102 directly contacts a lower surface and side surfaces of the lower portion 158a of the source implant region 158. Accordingly, the doped semiconductive material 108 substantially surrounds the lower portion 158a of the source implant region 158 on three sides. The upper portion 158b of the source implant region 158 may be formed in (e.g., extend entirely through) the source contact 120. At the process stage depicted in FIG. 2I, the source contact 120 directly contacts side surfaces of the upper portion 158b of the source implant region 158. For convenience, the lower portion 158a and the upper portion 158b are shown in the drawings as separate portions of the source implant region 158, although it is understood that the source implant region 158 may include a continuous portion of one or more (e.g., a single) doped material of an implant structure.

To form the source implant region 158, the source contact 120 and the doped semiconductive material 108 may be doped using the slit 150. The source implant region 158 may be formulated to exhibit an etch rate that is substantially different than (e.g., substantially less than) an etch rate of the source contact 120, the doped semiconductive material 108, and exposed polysilicon materials in the electronic device 100 when exposed to the same etch conditions. The source implant region 158 may, for example, be resistant to a tetramethylammonium hydroxide (TMAH)-based chemistry or other etch chemistries (e.g., phosphoric acid-based etch chemistries, ammonium hydroxide, hydrogen fluoride (HF), or other halogen-based etch chemistries) formulated to selectively remove polysilicon-based materials. By way of non-limiting example, the source implant region 158 may be formed by implanting a dopant into the source contact 120 to form the upper portion 158b and into the doped semiconductive material 108 to form the lower portion 158a thereof. The dopant may be implanted into the source contact 120 and the doped semiconductive material 108 at desired locations and at desired dimensions.

The source implant region 158 may be configured and formulated to protect conductive materials (e.g., the doped semiconductive material 108) of the source stack 102 during removal processes described herein. In particular, by forming the source implant region 158, the doped semiconductive material 108 is protected from being removed (e.g., exhumed) while sacrificial structures (e.g., polysilicon materials) are removed during formation of the slit 150 and additional openings utilized to form the source contact 120 adjacent to the pillar 130 and to perform replacement gate processes. Accordingly, the source implant region 158 may assist in maintaining the structure of the doped semiconductive material 108 by slowing (e.g., terminating) vertical progression of the (TMAH)-based chemistry or other etch chemistries to mitigate exposure of the source material 106 during material removal processes within the electronic device 100. By slowing vertical etch of exposed polysilicon, corrosion and/or overetch of the doped semiconductive material 108 and the source material 106 may be reduced or eliminated.

The dopant may provide etch selectivity to the source implant region 158 relative to the source contact 120, the doped semiconductive material 108, and other exposed materials. By way of example only, portions of the source contact 120 and the doped semiconductive material 108 may be implanted with boron, carbon, oxygen, nitrogen, gallium, or a combination thereof to form the portions 158a, 158b of the source implant region 158. The implant conditions and the dopant concentration may be tailored to achieve the desired etch selectivity of the source contact 120 and the doped semiconductive material 108 and other exposed materials relative to the source implant region 158. In some embodiments, the source implant region 158 comprises a boron-doped polysilicon material or a carbon-doped polysilicon material. The dopant implant conditions and dimensions of the slit 150 and the slit liner 154 proximal to the source contact 120 are used to control the distribution of the dopant in the source contact 120 and the doped semiconductive material 108, forming the respective portions 158a, 158b of the source implant region 158. A width of the source implant region 158 may, for example, be substantially the same as or less than a width between opposing sidewalls of the slit liner 154 in the slit 150. Alternatively, the width of the source implant region 158 may be substantially the same as or less than a width between opposing sidewalls of the slit liner 154 proximal to the source contact 120. Since dopant levels of the doped semiconductive material 108 and the source contact 120 may differ from one another prior to formation of the source implant region 158, the lower portion 158a may differ in material composition from a material composition of the upper portion 158b. The upper portion 158b may also include a different (e.g., greater than) dopant concentration than a dopant concentration of the lower portion 158a. The dopant may be implanted to a desired depth through the source contact 120 and into the doped semiconductive material 108, such as to a depth of from about 60 Å to about 1000 Å. A lateral dimension (e.g., the width) of the source implant region 158 may range from about 300 Å to about 1000 Å, such as from about 400 Å to about 800 Å.

While FIG. 2I illustrates the lower portion 158a and the upper portion 158b of the source implant region 158 being formed following formation of the source contact 120 for clarity, the disclosure is not so limited, and the portions 158a, 158b may individually be formed during separate process acts. For example, the lower portion 158a of the source implant region 158 may be formed in the doped semiconductive material 108 prior to formation of the source contact 120, and the upper portion 158b of the source implant region 158 may be formed in the source contact 120 following formation thereof.

Referring to FIG. 2J, a portion of the source contact 120 exposed through the slit 150 may be removed, recessing the source contact 120 adjacent to (e.g., under) the slit 150, and a second source contact opening 160 is formed. As shown in FIG. 2J, forming the second source contact opening 160 also exposes the upper surface of the doped semiconductive material 108 and surfaces (e.g., an upper surface, side surfaces) of the upper portion 158b of the source implant region 158. The upper portion 158b of the source implant region 158 extends into a lower portion of the second source contact opening 160, and a portion (e.g., a lower portion) of the source contact 120 is positioned at an elevational level of the upper portion 158b of the source implant region 158, without contacting the source implant region 158. Since the upper portion 158b of the source implant region 158 extends above the upper surface of the doped semiconductive material 108, formation of the second source contact opening 160 results in formation of recesses 162 (e.g., pockets) laterally adjacent to the upper portion 158b of the source implant region 158. In other words, the recesses 162 are on opposing sides of the source implant region 158 and interposed between side surfaces (e.g., lateral edge surfaces) of the upper portion 158b of the source implant region 158 and side surfaces of remaining portions of the source contact 120.

As shown in FIG. 2J, the lower portion 158a of the source implant region 158 extends beyond a lower surface of the source contact 120 and into the doped semiconductive material 108. The source contact 120 extends vertically beyond (e.g., above) an elevational level of the upper surface of the upper portion 158b of the source implant region 158. Following formation of the second source contact opening 160 including the recesses 162, the slit liner 154 may be removed from the side surfaces of the tiers 125 and the cap material 118 by conventional techniques.

Referring to FIG. 2K, the oxidized portion 148 may, optionally, be formed within one or more of the slit 150 and the second source contact opening 160. For example, exposed portions of one or more of the cap material 118 and the source contact 120 may be oxidized by conventional techniques to form the oxidized portion 148. The oxidized portion 148 may be present on side surfaces of the cap material 118 and the source contact 120. In some embodiments, an exposed upper surface of the doped semiconductive material 108 may also be oxidized to form an additional portion of the oxidized portion 148, such that the oxidized portion 148 extends along the upper surface of the doped semiconductive material 108 to exposed side surfaces of the source implant region 158. The oxidized portion 148 may extend to a bottom surface of the lowermost insulative materials 126 of the tiers 125. In this way, the oxidized portion 148 may form a continuous liner from the bottom surface of the lowermost insulative materials 126 of the tiers 125, along the side surfaces of the cap material 118 and the source contact 120, and along the upper surface of the doped semiconductive material 108 to the source implant region 158.

For ease of understanding the disclosure, portions of a respective material (e.g., the cap material 118, the source contact 120, the doped semiconductive material 108) that have been oxidized are collectively referred to herein as the oxidized portion 148, but it is understood that individual oxidized portions correspond to the respective material that has been oxidized to form the oxidized portion 148. The respective material may, therefore, exhibit a heterogeneous composition throughout its thickness, with the oxidized portion 148 including a higher concentration of oxygen atoms than additional portions of the respective material. The oxidized portion 148 (e.g., the oxygen-rich portion) exhibits a greater content (e.g., amount) of oxygen relative to the oxygen content of the as-formed additional portion of the respective material. The oxidized portion 148 may be formed by conventional techniques or, alternatively, the oxidized portion 148 may include a native oxide material formed on exposed surfaces of the respective material.

As shown in FIG. 2K, the source level conductive material 164 (e.g., a conductive liner material, a semiconductive liner material) may be formed on exposed surfaces of the tiers 125 and the oxidized portion 148, if present, in the slit 150 and on the upper portion 158b of the source implant region 158 in the second source contact opening 160. In embodiments in which the oxidized portion 148 is not present, the source level conductive material 164 is formed on exposed surfaces of the tiers 125, the cap material 118, the source contact 120, the upper portion 158b of the source implant region 158, and the doped semiconductive material 108. The source level conductive material 164 includes a lower portion (e.g., a remaining portion 164a) within the recesses 162 laterally adjacent to the source implant region 158 and an upper portion (e.g., a sacrificial portion 164b) over the upper surface of the upper portion 158b of the source implant region 158 and on the exposed surfaces of the tiers 125, the cap material 118, and the source contact 120. The source level conductive material 164 may be conformally formed by conventional techniques such that a portion of each of the slit 150 and the second source contact opening 160 remains open (e.g., unoccupied). For example, the source level conductive material 164 may be formed during one or more process acts by sequentially depositing a material (e.g., a conductive material), removing portions thereof, and depositing additional portions of the material so that the source level conductive material 164 is substantially continuous without voids or spaces (e.g., gaps). The source level conductive material 164 may be formed of and include a semiconductive material or a conductive material. In some embodiments, the source level conductive material 164 is undoped polysilicon. The source level conductive material 164 may be formed to a thickness of from about 30 Å to about 400 Å. Accordingly, the recesses 162 may be at least partially (e.g., substantially entirely) filled with the remaining portion 164a of the source level conductive material 164.

As shown in FIG. 2L, a portion of the source level conductive material 164 (e.g., the sacrificial portion 164b thereof (FIG. 2K)) is removed from the surfaces of the tiers 125, the cap material 118, and the source contact 120 to expose the upper surface of the upper portion 158b of the source implant region 158. However, the remaining portion 164a of the source level conductive material 164 is present within the recesses 162 such that opposing portions of the source level conductive material 164 are laterally adjacent to the upper portion 158b of the source implant region 158. As such, the source level conductive material 164 is interposed (e.g., laterally intervenes) between the source implant region 158 (e.g., the upper portion 158b thereof) and the source contact 120 in at least one horizontal direction (e.g., the X-direction). In other words, the source level conductive material 164 may separate (e.g., physically separate) the source implant region 158 from the source contact 120 by a desired distance. The sacrificial portion 164b of the source level conductive material 164 may be removed by conventional techniques. Since the source implant region 158 exhibits etch selectivity relative to a material of the source level conductive material 164, a material of the source implant region 158 may not be substantially removed during the material removal processes of the source level conductive material 164.

The remaining portion 164a of the source level conductive material 164 may comprise a substantially planar upper surface that is substantially parallel to a substantially planar upper surface of the doped semiconductive material 108. Upper surfaces of the opposing portions of the source level conductive material 164 may be vertically recessed relative to the upper surface of the source contact 120. In addition, the upper surfaces of the opposing portions of the source level conductive material 164 may be substantially coplanar with the upper surface of the source implant region 158, as shown in FIG. 2L. However, the disclosure is not so limited, and additional configurations may be contemplated. For example, the upper surfaces of the remaining portion 164a of the source level conductive material 164 may be elevated above or, alternatively, recessed below the upper surface of the source implant region 158. In other embodiments, the source level conductive material 164 may have a different profile, for example, a dish-shaped profile, a concave-shaped profile, a convex-shaped profile, or any other three-dimensional shape, so long as the source level conductive material 164 laterally intervenes between the upper portion 158b of the source implant region 158 and the source contact 120.

As shown in FIG. 2M, the tunnel dielectric material 136, the charge trap material 138, and the charge blocking material 140 do not extend continuously along the entire height of the pillars 130 since the portions adjacent to (e.g., laterally adjacent to) the source contact 120 have been removed. Therefore, the portions of the tunnel dielectric material 136, the charge trap material 138, and the charge blocking material 140 below the source contact 120 are not connected to the portions above the source contact 120.

Since the source level conductive material 164 laterally intervenes between the source implant region 158 (e.g., the upper portion 158b thereof) and the source contact 120, the source contact 120 may be spaced apart from the source implant region 158 on at least one side (e.g., two opposing sides) of the source implant region 158 in a horizontal direction (e.g., the X-direction). For example, the source contact 120 may terminate in the horizontal direction at lateral edge surfaces 168 that are spaced apart from the source implant region 158 by at least some distance on opposing sides (e.g., lateral sides, horizontal sides) of the source implant region 158 in the horizontal direction. As a non-limiting example, the source contact 120 may terminate in the horizontal direction at a first lateral edge surface 168 that is spaced apart from the source implant region 158 on a first side thereof, and the source contact 120 may terminate in the horizontal direction at a second lateral edge surface 168 that is spaced apart from the source implant region 158 on a second, opposite side thereof. Thus, the source contact 120 directly contacts the source stack 102 (e.g., the doped semiconductive material 108 thereof) and the channel 134 of the pillar 130, without contacting the source implant region 158.

Subsequent process acts are then conducted to form the electronic device 100, as shown in FIG. 2M. The subsequent process acts are conducted by conventional techniques. By way of example only, a replacement gate process is conducted to remove the additional insulative materials 128 (FIG. 2L) of the tiers 125 (FIG. 2L) and to form the conductive materials 166 (e.g., conductive structures) of the tiers 145 of the tier stack 141. The additional insulative materials 128 may be removed by exposing the tiers 125 to a wet etch chemistry formulated to remove, for example, silicon nitride. The wet etchant may include, but is not limited to, one or more of phosphoric acid, sulfuric acid, hydrochloric acid, nitric acid, or a combination thereof. In some embodiments, the additional insulative materials 128 of the tiers 125 are removed using a so-called "wet nitride strip" that includes phosphoric acid. While FIGS. 1A through 2M illustrate the formation of the electronic device 100 by the replacement gate process, methods according to embodiments of the disclosure may be used to form the electronic device 100 by a floating gate process.

Formation of the conductive materials 166 may form strings 174 of memory cells 176, individual memory cells 176 located at intersections of the cell films of the pillars 130 and the conductive materials 166 of the tiers 145. The memory cells 176 are laterally adjacent to the conductive materials 166 of the tiers 145.

The fill material 172 (e.g., one or more dielectric materials) may be formed in the slit 150 (FIG. 2L) to form the slit structure 170, such as a single dielectric material, a combination of a dielectric material and silicon, or a combination of a dielectric material and a conductive material. The upper portion 158b of the source implant region 158 and the source level conductive material 164 are within the slit structure 170. The fill material 172 may be in direct contact with the source level conductive material 164, the source contact 120, and the source implant region 158, without being in direct contact with the doped semiconductive material 108 of the source stack 102. Thus, the fill material 172 may be in direct contact with the upper surface of the source implant region 158, without being in direct contact with sidewalls thereof. The fill material 172 may be adjacent to the oxidized portion 148, if present, of the cap material 118 and the source contact 120.

The source implant region 158 and the source level conductive material 164 are in vertical alignment with the fill material 172. For example, the source implant region 158 is vertically aligned with the fill material 172, without being vertically aligned with the alternating insulative materials 126 and the conductive materials 166 of the tiers 145 of the tier stack 141. In other words, the fill material 172 overlies the source implant region 158, without the alternating insulative materials 126 and the conductive materials 166 of the tiers 145 overlying the source implant region 158. Thus, vertical interfaces between the upper portion 158b of the source implant region 158 and the opposing portions of the source level conductive material 164 are in vertical alignment with the fill material 172. Portions (e.g., lateral end portions) of the slit structure 170 and the underlying source level conductive material 164 extend laterally below the tier stack 141 such that a portion of the fill material 172 of the slit structure 170 and the source level conductive material 164 directly underlies the tier stack 141. By forming the source implant region 158 through the slit 150 (FIG. 2L), elongated portions of the source implant region 158 may be centrally aligned within the slit structure 170, without being in contact with opposing portions of the source contact 120. The source implant region 158 and the source level conductive material 164 of the disclosure mitigate corrosion of conductive materials (e.g., the doped semiconductive material 108) of the source stack 102 during formation and removal of additional conductive materials.

As shown in FIG. 2M, the source implant region 158 exhibits a width $W_1$ in a first horizontal direction (e.g., the X-direction) that is substantially orthogonal to a second horizontal direction (e.g., the Y-direction) in which the slit structure 170 extends. By way of non-limiting example, the width $W_1$ of the source implant region 158, may be within a range of from about 300 Å to about 2000 Å, such as from about 300 Å to about 600 Å, from about 600 Å to about 1200 Å, from about 1200 Å to about 1500 Å, or from about 1500 Å to about 2000 Å.

The fill material 172 exhibits different widths in the first horizontal direction, with a lower portion of the fill material 172 exhibiting one or more different widths than an upper portion thereof. As the lower portion of the slit 150 (FIG. 2L), corresponding to the slit sacrificial structure 124 (FIG. 2C), and the second source contact opening 160 (FIG. 2L) are filled with the fill material 172, the fill material 172 exhibits different widths in the lower portion than in the upper portion (e.g., laterally adjacent to the tiers 145 of the tier stack 141). The fill material 172 is formed above (e.g., vertically above) the source implant region 158, and a width $W_2$ of the fill material 172 laterally adjacent to the source contact 120 may be relatively greater than the width $W_1$ of the source implant region 158. The width $W_2$ of the fill material 172 laterally adjacent to the source contact 120 may also be relatively greater than a width $W_3$ of the fill material 172 laterally adjacent to the cap material 118. In some embodiments, each of the width $W_2$ of the fill material 172 and the width $W_3$ of the fill material 172 may be relatively greater than the width $W_1$ of the source implant region 158. Further, the width $W_2$ of the fill material 172 may be about three times (3×) greater than the width $W_1$ of the source implant region 158. In other words, a ratio of the $W_2:W_1$ (e.g., a ratio of a distance separating opposing portions of the source contact 120 to a distance separating opposing portions of the source level conductive material 164) is about 3:1. In some embodiments, the $W_2:W_1$ ratio is different than 3:1 (e.g., 2:1, 4:1, or 5:1). However, the disclosure is not so limited and the $W_2:W_1$ ratio may be different than those described. The $W_2:W_1$ ratio may be tailored to facilitate a desired dimension (e.g., a width) of the source level conductive material 164 that may be selected at least partially based on design requirements of the electronic device 100. The differing widths of the fill material 172 may be present in some regions of the electronic device 100, such as in one or more array regions, periphery regions of the electronic device 100.

As shown in FIG. 2M, the upper portion 158b of the source implant region 158 (e.g., a portion of the source implant region 158 extending above the upper surface of the doped semiconductive material 108) may exhibit a height $H_2$, and source contact 120 may exhibit the height $H_1$ that is relatively greater than the height $H_2$ of the upper portion 158b of the source implant region 158. Accordingly, the height $H_1$, which is the distance separating the cap material 118 from the source stack 102, corresponds to the thickness of the source contact 120, which height $H_1$ is relatively greater than the height $H_2$ of the upper portion 158b of the source implant region 158. The height $H_2$ of the upper portion 158b of the source implant region 158 may be within a range of from about 30 Å to about 800 Å. Since the slightly recessed portion of the source contact 120 proximal to the slit 150 is relatively less than a total thickness of the source contact 120 distal to the slit 150, the upper portion 158*b* of the source implant region 158 extends (e.g., vertically extends) adjacent to the source contact 120, without upper surfaces of the source implant region 158 and the source contact 120 being coplanar with one another. In addition, since the upper surfaces of the opposing portions of the source level conductive material 164 are substantially coplanar with the upper surface of the source implant region 158, in some embodiments, the height $H_2$ of the upper portion 158*b* of the source implant region 158 and a height of the source level conductive material 164 may be substantially the same.

Further, a height $H_3$ of the source implant region 158 corresponds to a combined height of the lower portion 158*a* of the source implant region 158 within the doped semiconductive material 108 and the upper portion 158*b* thereof above the upper surface of the doped semiconductive material 108. By way of non-limiting example, the height $H_3$ of the source implant region 158, may be within a range of from about 60 Å to about 1000 Å, such as from about 60 Å to about 150 Å, from about 150 Å to about 300 Å, from about 300 Å to about 450 Å, from about 450 Å to about 600 Å, from about 600 Å to about 750 Å, or from about 750 Å to about 1000 Å.

In some embodiments, the height $H_2$ of the upper portion 158*b* of the source implant region 158 and a height of the lower portion 158*a* thereof are substantially the same, such that a height in the vertical direction of the upper portion 158*b* vertically above the upper surface of the doped semiconductive material 108 and laterally adjacent to the source level conductive material 164 is substantially the same as (e.g., substantially equal to) a height in the vertical direction of the lower portion 158*a* vertically below the upper surface of the doped semiconductive material 108 and laterally adjacent to the lower portion of the pillar 130 recessed therewithin. However, the disclosure is not so limited, and additional configurations may be contemplated. For example, the height of the lower portion 158*a* of the source implant region 158 may be relatively greater or, alternatively, relatively less than the height $H_2$ of the upper portion 158*b* thereof. Further, the height $H_3$ of the source implant region 158 may be relatively greater than the width $W_1$ of the source implant region 158, such that the source implant region 158 exhibits a greater dimension in the vertical direction (e.g., the Z-direction) than a dimension in the horizontal direction (e.g., the X-direction). A lower surface of the source implant region 158 may be elevated relative to a lower surface of the pillar 130 within the doped semiconductive material 108. However, the lower surface of the source implant region 158 may be at or below an elevational level of the lower surface of the pillar 130, so long as the source implant region 158 is isolated from the source material 106.

One of ordinary skill in the art will appreciate that, in accordance with additional embodiments of the disclosure, the features and feature configurations described above in relation to FIGS. 1A through 2M may be adapted to design needs of different electronic devices (e.g., different memory devices). By way of non-limiting example, in accordance with additional embodiments of the disclosure, FIG. 2N shows a simplified partial cross-sectional view of an electronic device 100' having a different configuration than the electronic device 100 following the processing stage of FIG. 2M. Throughout the remaining description and the accompanying figures, functionally similar features (e.g., structures, devices) are referred to with similar reference numerals. To avoid repetition, not all features shown in the remaining figures (including FIG. 2N) are described in detail herein. Rather, unless described otherwise below, a feature designated by a reference numeral of a previously described feature (whether the previously described feature is first described before the present paragraph, or is first described after the present paragraph) will be understood to be substantially similar to the previously described feature.

The electronic device 100' of FIG. 2N may include the source stack 102 including the conductive material 104, the source material 106, and the doped semiconductive material 108. The source contact 120 is adjacent to the source stack 102, the cap material 118 is adjacent to the source contact 120, and the dielectric cap materials 122 may, optionally, be adjacent to the cap material 118. The electronic device 100' may also include the tiers 145 of the alternating insulative materials 126 and conductive materials 166, as well as the pillar 130 extending through the tiers 145 of the tier stack 141. The pillar 130 includes the fill material 132, the channel 134, the tunnel dielectric material 136, and the charge blocking material 140. One or more of the tiers 145 proximal the cap material 118 functions as the SGS 146. One or more of the source contact 120, the cap material 118, and the doped semiconductive material 108 may, optionally, include the oxidized portion 148.

The electronic device 100' may also include the implant structure (e.g., the source implant region 158) including the lower portion 158*a* within an upper portion of the source stack 102 and the upper portion 158*b* laterally adjacent to the source contact 120. As in the previous embodiment of FIG. 2M, the source contact 120 may terminate in the horizontal direction at the lateral edge surfaces 168 that are spaced apart from the source implant region 158 by at least some distance on opposing sides (e.g., lateral sides, horizontal sides) of the source implant region 158 in the horizontal direction.

As shown in FIG. 2N, opposing portions of the fill material 172 of the slit structure 170 may be formed in place of the source level conductive material 164 (FIG. 2M). As such, portions of the fill material 172 are adjacent to (e.g., directly laterally adjacent to, directly vertically adjacent to) the source implant region 158 (e.g., the upper portion 158*b* thereof). Accordingly, opposing portions of the fill material 172 laterally intervene between the upper portion 158*b* of the source implant region 158 and the source contact 120. In the embodiment of FIG. 2N, the fill material 172 directly contacts the upper surface of the doped semiconductive material 108 or the oxidized portion 148 thereof, if present. The fill material 172 directly contacts an upper surface and side surfaces of the upper portion 158*b* of the source implant region 158. Accordingly, the fill material 172 substantially surrounds the upper portion 158*b* of the source implant region 158 on three sides.

Formation of the electronic device 100' may be achieved by utilizing the process acts illustrated in FIGS. 2A through 2J, for example, without including additional process acts illustrated in FIGS. 2K through 2M. Following formation of the second source contact opening 160 (FIG. 2J) including the recesses 162 (FIG. 2J), the slit liner 154 may be removed and the replacement gate process may be conducted to replace the additional insulative materials 128 (FIG. 2L) of the tiers 125 (FIG. 2L) with the conductive materials 166 of the tiers 145. Thereafter, the fill material 172 of the slit structure 170 may be formed within the slit 150 (FIG. 2J), without forming the source level conductive material 164 (FIG. 2M) of the embodiment of the electronic device 100. By forming the fill material 172 within the recesses 162 (FIG. 2J) of the second source contact opening 160 (FIG. 2J)

and laterally adjacent to the source implant region 158, manufacturing costs may be reduced. The source implant region 158 and the opposing portions of the fill material 172 of the disclosure mitigate corrosion of conductive materials (e.g., the doped semiconductive material 108) of the source stack 102 during formation and removal of additional conductive materials.

As described above, forming the electronic device 100 of the embodiment of FIGS. 1A through 2M to include the source implant region 158 within an upper portion of the source stack 102 and laterally adjacent to the source contact 120, as well as the source level conductive material 164 laterally adjacent to the source implant region 158, may facilitate improved performance of the electronic device 100. Similarly, forming the electronic device 100' of the embodiment of FIG. 2N to include the source implant region 158 within an upper portion of the source stack 102 and laterally adjacent to the source contact 120, as well as the opposing portions of the fill material 172 of the slit structure 170 laterally adjacent to the source implant region 158, may facilitate improved performance of the electronic device 100'.

One or more electronic devices 100, 100' according to embodiments of the disclosure may be present in an apparatus or in an electronic system. The electronic devices 100, 100', the apparatus including the one or more electronic devices 100, 100', or the electronic system including the one or more electronic devices 100, 100' may include additional components, which are formed by conventional techniques. The additional components may include, but are not limited to, staircase structures, interdeck structures, contacts, interconnects, data lines (e.g., bit lines), access lines (e.g., word lines), etc. The additional components may be formed during the fabrication of the electronic devices 100, 100' or after the electronic devices 100, 100' have been fabricated. By way of example only, one or more of the additional components may be formed before or after the cell films of the pillars 130 are formed, while other additional components may be formed after the electronic devices 100, 100' have been fabricated. The additional components may be present in locations of the electronic devices 100, 100' or the apparatus that are not depicted in the perspectives of FIGS. 1A through 2N.

Formation of the source implant region 158 within an upper portion of the source stack 102 and laterally adjacent to the source contact 120 may facilitate selective removal of polysilicon materials of the electronic devices 100, 100' without exposing portions of the source stack 102 beneath the source implant region 158 to the removal condition. Formation of the source level conductive material 164 of the electronic device 100 or, alternatively, the opposing portions of the fill material 172 of the slit structure 170 of the electronic device 100' laterally intervening between the source implant region 158 and the source contact 120 may further protect surrounding materials. By protecting the source stack 102, corrosion of conductive materials (e.g., the doped semiconductive material 108) of the source stack 102 is reduced or eliminated. Thus, the integrity of the conductive materials of the source stack 102 within the electronic devices 100, 100' may be maintained. Moreover, by preventing unintentional removal of the doped semiconductive material 108, the methods and structures described herein provide one or more of improved performance, reliability, and durability, lower costs, as compared to conventional structures, conventional devices, and conventional systems.

Accordingly, in some embodiments, an electronic device comprises a source stack comprising one or more conductive materials, a source contact adjacent to the source stack, tiers of alternating conductive materials and insulative materials adjacent to the source contact, pillars extending through the tiers and the source contact and into the source stack, a slit structure extending through the tiers and the source contact, and an implant structure extending within the slit structure and into the source stack.

Accordingly, in further embodiments, an electronic device comprises a stack comprising tiers of alternating conductive structures and insulative structures overlying a source structure, and pillars vertically extending through the stack and into the source structure. The pillars comprise a channel material. The electronic device comprises a source contact adjacent to the channel material of the pillars, and a source implant region laterally adjacent to the source contact and laterally adjacent to lower portions of the pillars within the source structure.

Accordingly, in at least some embodiments, a method of forming an electronic device comprises forming a source stack comprising a doped semiconductive material, forming a source contact sacrificial structure adjacent to the doped semiconductive material, and forming tiers adjacent to the source contact sacrificial structure. The tiers comprise alternating insulative materials and additional insulative materials. The method comprises forming pillars through the tiers and into the source stack. The pillars include a channel. The method comprises forming a slit through the tiers to expose the source contact sacrificial structure, removing the source contact sacrificial structure to form a source contact opening, forming a conductive material in the source contact opening to form a source contact extending laterally and substantially surrounding the channel of the pillars, and forming a source implant region extending through the conductive material of the source contact and into a portion of the doped semiconductive material.

Figure 3:
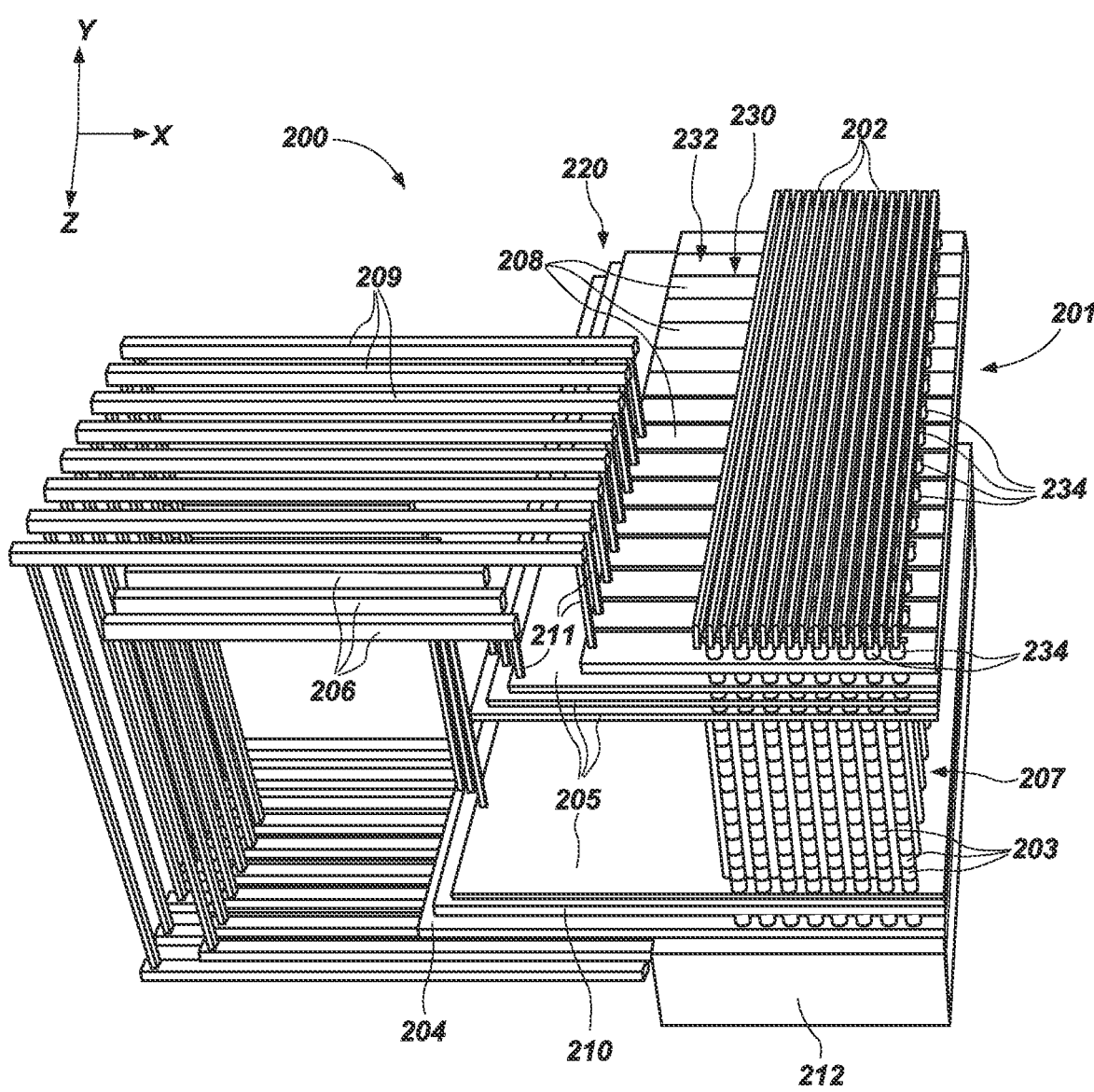
FIG. 3 is a partial cutaway perspective view of an electronic device, in accordance with embodiments of the disclosure.

FIG. 3 illustrates a partial cutaway perspective view of a portion of an electronic device 200 (e.g., a microelectronic device, a memory device, such as a 3D NAND Flash memory device) including one or more electronic device structures 201 (e.g., a microelectronic device structure). The electronic device 200 may include one or more of the electronic devices 100, 100' previously described with reference to FIGS. 1A through 2N. As shown in FIG. 3, the electronic device structure 201 of the electronic device 200 may include a staircase structure 220 defining contact regions for connecting interconnect lines 206 to conductive structures 205 (e.g., corresponding to the conductive materials 166 (FIGS. 2M and 2N)). The electronic device structure 201 may include vertical strings 207 (e.g., corresponding to the strings 174 (FIGS. 2M and 2N)) of memory cells 203 (e.g., corresponding to the memory cells 176 (FIGS. 2M and 2N)) that are coupled to each other in series. The vertical strings 207 may extend vertically (e.g., in the Z-direction) and orthogonally to conductive lines and the conductive structures 205, such as the data lines 202, a source tier 204 (e.g., corresponding to the source stack 102 (FIGS. 2M and 2N), the interconnect lines 206, first select gates 208 (e.g., upper select gates, drain select gates (SGDs)), select lines 209, and a second select gate 210 (e.g., a lower select gate, a source select gate (SGS) corresponding to the SGS 146 (FIGS. 2M and 2N)). The source tier 204 includes the source implant region 158 (FIGS. 2M and 2N) within the upper portion of the source tier 204 and laterally adjacent to the source contact 120 (FIGS. 2M and 2N)). The select gates 208 may be horizontally divided (e.g., in the Y-direction) into multiple blocks 232 (e.g., corresponding to the blocks 151 (FIG. 2D)) horizontally separated (e.g., in the Y-direction) from one another by slits 230 (e.g., corresponding to the slit structure 170 (FIGS. 2M and 2N) within the slit 150 (FIG. 2L)).

Vertical conductive contacts 211 may electrically couple components to each other as shown. For example, the select lines 209 may be electrically coupled to the first select gates 208 and the interconnect lines 206 may be electrically coupled to the conductive structures 205. The electronic device 200 may also include a control unit 212 positioned under the memory array, which may include at least one of string driver circuitry, pass gates, circuitry for selecting gates, circuitry for selecting conductive lines (e.g., the data lines 202, the interconnect lines 206), circuitry for amplifying signals, and circuitry for sensing signals. The control unit 212 may be electrically coupled to the data lines 202, the source tier 204, the interconnect lines 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., digit lines, bit lines) may extend horizontally in a second direction (e.g., in the Y-direction) that is at an angle (e.g., perpendicular) to the first direction in which the first select gates 208 extend. Individual data lines 202 may be coupled to individual groups of the vertical strings 207 extending the second direction (e.g., the Y-direction) at the first end (e.g., the upper end) of the vertical strings 207 of the individual groups. Additional individual groups of the vertical strings 207 extending the first direction (e.g., the X-direction) and coupled to individual first select gates 208 may share a particular vertical string 207 thereof with individual group of vertical strings 207 coupled to an individual data line 202. Thus, an individual vertical string 207 of memory cells 203 may be selected at an intersection of an individual first select gate 208 and an individual data line 202. Accordingly, the first select gates 208 may be used for selecting memory cells 203 of the vertical strings 207 of memory cells 203.

The conductive structures 205 (e.g., word lines) may extend in respective horizontal planes. The conductive structures 205 may be stacked vertically, such that each conductive structure 205 is coupled to at least some of the vertical strings 207 of memory cells 203, and the vertical strings 207 of the memory cells 203 extend vertically through the stack structure including the conductive structures 205. The conductive structures 205 may be coupled to or may form control gates of the memory cells 203.

The first select gates 208 and the second select gates 210 may operate to select a vertical string 207 of the memory cells 203 interposed between data lines 202 and the source tier 204. Thus, an individual memory cell 203 may be selected and electrically coupled to a data line 202 by operation of (e.g., by selecting) the appropriate first select gate 208, second select gate 210, and conductive structure 205 that are coupled to the particular memory cell 203.

The staircase structure 220 may be configured to provide electrical connection between the interconnect lines 206 and the conductive structures 205 through the vertical conductive contacts 211. In other words, an individual conductive structure 205 may be selected via an interconnect line 206 in electrical communication with a respective vertical conductive contact 211 in electrical communication with the conductive structure 205. The data lines 202 may be electrically coupled to the vertical strings 207 through conductive contact structures 234.

Figure 4:
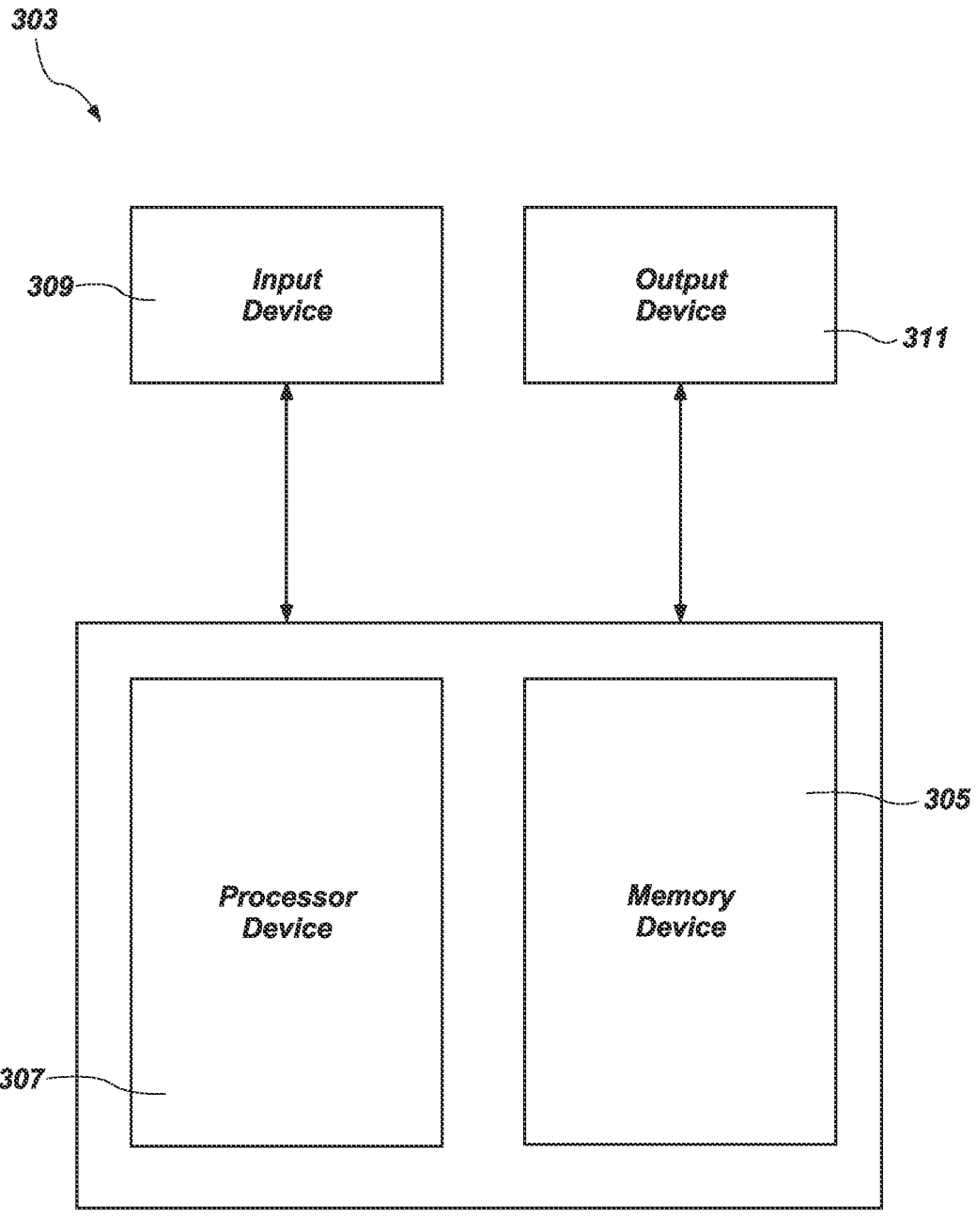
FIG. 4 is a block diagram of a system, in accordance with embodiments of the disclosure.

Electronic devices (e.g., the electronic devices 100, 100', 200) including the source implant region 158 within an upper portion of the source stack 102 and laterally adjacent to the source contact 120, according to embodiments of the disclosure, may be used in embodiments of electronic systems of the disclosure. For example, FIG. 4 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of an electronic device previously described herein (e.g., the electronic devices 100, 100', 200 previously described with reference to FIGS. 1A through 2N and FIG. 3) including the source implant region 158 within an upper portion of the source stack 102 and laterally adjacent to the source contact 120.

The electronic system 303 may further include at least one electronic signal processor device 307 (often referred to as a "microprocessor"). The electronic signal processor device 307 may optionally include an embodiment of an electronic device previously described herein (e.g., one or more of the electronic devices 100, 100', 200 previously described with reference to FIGS. 1A through 2N and FIG. 3). The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 5:
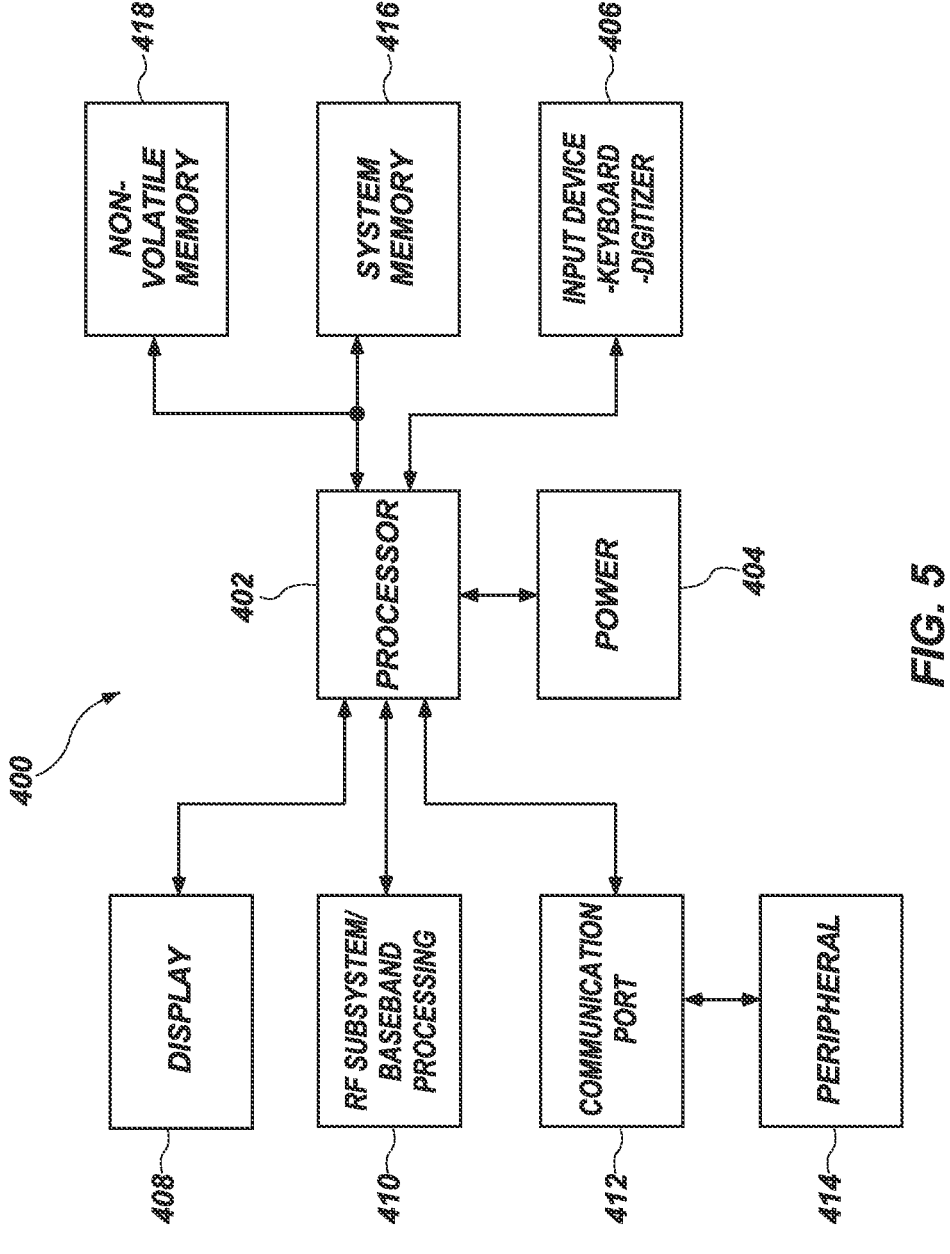
FIG. 5 is a block diagram of a processor-based system, in accordance with embodiments of the disclosure.

With reference to FIG. 5, depicted is a processor-based system 400. The processor-based system 400 may include various electronic devices (e.g., the electronic devices 100, 100', 200) manufactured in accordance with embodiments of the present disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include electronic devices (e.g., the electronic devices 100, 100', 200) manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as the electronic devices (e.g., the electronic devices 100, 100', 200) described above, or a combination thereof.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include electronic devices, such as the electronic devices (e.g., the electronic devices 100, 100', 200) described above, or a combination thereof.

Accordingly, in at least some embodiments, a system comprises a processor operably coupled to an input device and an output device, and one or more electronic devices operably coupled to the processor. The one or more electronic devices comprise strings of memory cells extending vertically through a stack comprising a vertically alternating sequence of insulative structures and conductive structures, and slit structures extending vertically through the stack and separating the stack into blocks. Each block comprises some of the strings of memory cells. The one or more electronic devices comprise a lateral contact region adjacent to the strings of memory cells, source implant structures extending laterally and centrally located within lower portions of the slit structures, and a dielectric material or a semiconductive material laterally separating the source implant structures from the lateral contact region.

The electronic devices and systems of the disclosure advantageously facilitate one or more of improved simplicity, greater packaging density, and increased miniaturization of components as compared to conventional devices and conventional systems. The methods of the disclosure facilitate the formation of devices (e.g., apparatuses, microelectronic devices, memory devices) and systems (e.g., electronic systems) having one or more of improved performance, reliability, and durability, lower costs, increased yield, increased miniaturization of components, improved pattern quality, and greater packaging density as compared to conventional devices (e.g., conventional apparatuses, conventional electronic devices, conventional memory devices) and conventional systems (e.g., conventional electronic systems).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device, comprising:
   a source stack comprising one or more conductive materials;
   a source contact adjacent to the source stack;
   tiers of alternating conductive materials and insulative materials adjacent to the source contact;
   pillars extending through the tiers and the source contact and into the source stack;
   a slit structure extending through the tiers and the source contact; and
   an implant structure extending within the slit structure and into the source stack, an upper portion of the implant structure above the source stack and wholly contained within the slit structure.

2. The electronic device of claim 1, wherein at least a portion of the source contact is at an elevational level of the upper portion of the implant structure, the source contact comprising a conductive material extending laterally adjacent to a channel of the pillars.

3. The electronic device of claim 2, wherein the source contact directly contacts the source stack and the channel of the pillars, without contacting the implant structure.

4. The electronic device of claim 1, further comprising a conductive material within the slit structure and laterally interposed between the implant structure and the source contact, wherein upper surfaces of the conductive material are substantially coplanar with an upper surface of the implant structure.

5. The electronic device of claim 1, wherein the source contact comprises doped polysilicon and the implant structure comprises one or more boron-doped materials or one or more carbon-doped materials.

6. The electronic device of claim 1, wherein a lower surface of the source contact directly contacts a doped semiconductive material of the source stack and one or more dielectric materials of the pillars, a portion of the implant structure extending beyond the lower surface of the source contact and into the doped semiconductive material of the source stack.

7. The electronic device of claim 1, wherein the implant structure is vertically aligned with a dielectric material of the slit structure, without the alternating conductive materials and insulative materials of the tiers overlying the implant structure.

8. The electronic device of claim 1, wherein a width of the implant structure in a first horizontal direction is relatively less than a width of the slit structure in the first horizontal direction that is substantially orthogonal to a second horizontal direction in which the slit structure extends, elongated portions of the implant structure extending in the second horizontal direction.

9. An electronic device, comprising:
    a stack comprising tiers of alternating conductive structures and insulative structures overlying a source structure;
    pillars vertically extending through the stack and into the source structure, the pillars comprising a channel material;
    a source contact adjacent to the channel material of the pillars;
    a source implant region laterally adjacent to the source contact and laterally adjacent to lower portions of the pillars within the source structure; and
    opposing portions of a source level conductive material between the source contact and the source implant region, upper surfaces of the source level conductive material vertically recessed relative to an upper surface of the source contact.

10. The electronic device of claim 9, wherein the source contact vertically separates the tiers from the source structure, the source contact extending vertically beyond an elevational level of an upper surface of the source implant region.

11. The electronic device of claim 9, wherein the source implant region comprises a boron-doped polysilicon material, an upper portion of the source implant region separating opposing portions of a dielectric material and a lower portion of the source implant region extending within the source structure.

12. The electronic device of claim 9, wherein a polysilicon material of the source structure substantially surrounds the source implant region on three sides.

13. A method of forming an electronic device, the method comprising:
    forming a source stack comprising one or more conductive materials including a doped semiconductive material;
    forming a source contact sacrificial structure adjacent to the doped semiconductive material;
    forming tiers adjacent to the source contact sacrificial structure, the tiers comprising alternating insulative materials and additional insulative materials;
    forming pillars extending through the tiers and the source contact and into the source stack, the pillars including a channel;
    forming a slit through the tiers to expose the source contact sacrificial structure;
    removing the source contact sacrificial structure to form a source contact opening;
    forming a conductive material in the source contact opening to form a source contact adjacent to the source stack, the source contact extending laterally and substantially surrounding the channel of the pillars;
    forming an implant structure extending through the conductive material of the source contact and into a portion of the doped semiconductive material;
    replacing the additional insulative materials of the tiers with conductive materials to form tiers of alternating conductive materials and insulative materials adjacent to the source contact; and
    forming a fill material within the slit to form a slit structure extending through the tiers and the source contact, the implant structure extending within the slit structure and into the source stack, an upper portion of the implant structure above the source stack and wholly contained within the slit structure.

14. The method of claim 13, further comprising:
    removing a portion of the source contact to form an additional source contact opening and to expose the doped semiconductive material and the implant structure;
    forming a conductive liner material over exposed surfaces of the doped semiconductive material and the implant structure; and
    removing portions of the conductive liner material to expose an upper surface of the implant structure.

15. The method of claim 14, wherein the implant structure is formulated so that each of the doped semiconductive material of the source stack, the conductive material of the source contact, and the conductive liner material is selectively etchable relative to the implant structure.

16. The method of claim 14, wherein:
    forming the conductive liner material comprises conformally forming a polysilicon material directly adjacent to the alternating insulative materials and additional insulative materials of the tiers, the source contact, the doped semiconductive material, and the implant structure; and
    removing portions of the conductive liner material comprises retaining additional portions of the conductive liner material in recesses laterally separating the implant structure from the source contact.

17. The method of claim 13, wherein forming the fill material within the slit comprises forming the fill material in direct contact with the source contact, the implant structure, and the doped semiconductive material of the source stack.

18. The method of claim 13, further comprising forming one or more cap materials adjacent to the source contact sacrificial structure and forming a slit sacrificial structure comprising one or more conductive materials in the one or more cap materials, wherein forming the slit comprises removing the slit sacrificial structure to expose the source contact sacrificial structure.

19. The method of claim 13, further comprising forming a liner material within the slit and selectively removing horizontal portions of the liner material prior to removing the source contact sacrificial structure.

20. The method of claim 13, further comprising removing portions of a charge blocking material, a charge trap material, and a tunnel dielectric material of the pillars to expose the channel prior to forming the source contact.

21. The method of claim 13, wherein forming the source stack comprises forming a doped polysilicon material over a tungsten silicide material, the implant structure formed within an upper portion of the doped polysilicon material and isolated from the tungsten silicide material by a lower portion of the doped polysilicon material.

22. The method of claim 13, wherein forming the implant structure comprises implanting the conductive material of the source contact and the doped semiconductive material of the source stack with boron, carbon, oxygen, nitrogen, gallium, or a combination thereof.

23. The method of claim 13, wherein forming the implant structure comprises forming a boron-doped or a carbon-doped polysilicon material in a single processing act.

24. A system, comprising:

a processor operably coupled to an input device and an output device; and one or more electronic devices operably coupled to the processor, the one or more electronic devices comprising:

strings of memory cells extending vertically through a stack comprising a vertically alternating sequence of insulative structures and conductive structures;

slit structures extending vertically through the stack and separating the stack into blocks, each block comprising some of the strings of memory cells;

a lateral contact region adjacent to the strings of memory cells;

source implant structures extending laterally and centrally located within lower portions of the slit structures; and a dielectric material or a semiconductive material laterally separating the source implant structures from the lateral contact region, the lateral contact region and the source implant structures in direct contact with the dielectric material or the semiconductive material.

* * * * *